United States Patent
Park et al.

(10) Patent No.: US 6,872,258 B2
(45) Date of Patent: Mar. 29, 2005

(54) SHOWER HEAD OF A WAFER TREATMENT APPARATUS HAVING A GAP CONTROLLER

(75) Inventors: Jong-chul Park, Suwon (KR); Dong-hyun Kim, Seoul (KR); O-ik Kwon, Seoul (KR); Hye-jin Jo, Anyang (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/178,757

(22) Filed: Jun. 25, 2002

(65) Prior Publication Data

US 2003/0010452 A1 Jan. 16, 2003

(30) Foreign Application Priority Data

Jul. 16, 2001 (KR) .......................................... 2001-42822

(51) Int. Cl.[7] .......................... C23C 16/00; C23F 1/00; H01L 21/306
(52) U.S. Cl. .............. 118/715; 156/345.33; 156/345.34
(58) Field of Search ................................ 118/715, 728, 118/50; 156/345.29, 345.33, 345.34, 345.35, 345.36, 345.26, 345.51

(56) References Cited

U.S. PATENT DOCUMENTS

| | | | | |
|---|---|---|---|---|
| 3,809,050 A | * | 5/1974 | Chough et al. ................ 125/35 |
| 4,134,425 A | * | 1/1979 | Gussefeld et al. ......... 137/625.3 |
| 4,792,378 A | * | 12/1988 | Rose et al. .................. 438/706 |
| 4,820,371 A | * | 4/1989 | Rose ...................... 156/345.51 |
| 5,074,456 A | * | 12/1991 | Degner et al. .............. 228/121 |
| 5,336,324 A | * | 8/1994 | Stall et al. .................... 118/719 |
| 5,423,936 A | * | 6/1995 | Tomita et al. .......... 156/345.34 |
| 5,441,568 A | * | 8/1995 | Cho et al. .................... 118/715 |
| 5,480,678 A | * | 1/1996 | Rudolph et al. .......... 427/248.1 |
| 5,589,002 A | * | 12/1996 | Su .......................... 118/723 E |
| 5,766,364 A | * | 6/1998 | Ishida et al. ................. 118/725 |
| 5,853,485 A | * | 12/1998 | Rudolph et al. ............. 118/715 |
| 5,968,374 A | | 10/1999 | Bullock ......................... 216/16 |
| 6,086,677 A | * | 7/2000 | Umotoy et al. ............. 118/715 |
| 6,110,556 A | * | 8/2000 | Bang et al. ................. 428/64.1 |
| 6,123,775 A | * | 9/2000 | Hao et al. .................... 118/724 |
| 6,207,006 B1 | | 3/2001 | Katoh .................... 156/345.29 |
| 6,223,684 B1 | * | 5/2001 | Fujioka et al. .......... 118/723 R |
| 6,245,192 B1 | * | 6/2001 | Dhindsa et al. ......... 156/345.34 |
| 6,302,964 B1 | * | 10/2001 | Umotoy et al. ............. 118/715 |
| 6,432,831 B2 | * | 8/2002 | Dhindsa et al. ............. 438/710 |
| 6,454,864 B2 | * | 9/2002 | Wytman ...................... 118/728 |
| 6,502,530 B1 | * | 1/2003 | Turlot et al. ............. 118/723 E |

* cited by examiner

Primary Examiner—Rudy Zervigon
(74) Attorney, Agent, or Firm—Lee, Sterba & Morse, P.C.

(57) ABSTRACT

A shower head for adjusting distribution of a reactant gas in a process region of a semiconductor manufacturing reaction chamber, wherein a top plate has a gas port for introducing the reactant gas into the reaction chamber; a face plate, having through holes, disposed opposite the process region; a first baffle plate, having through holes, disposed between the top plate and the face plate and capable of moving up or down, wherein the first baffle plate has a top surface that defines a first gap for forming a first lateral flow passage; a second baffle plate, having through holes, disposed between the first baffle plate and the face plate and capable of moving up or down, wherein the second baffle plate has a top surface that defines a second gap for forming a second lateral flow passage; and a gap controller for determining widths of the first and second gaps.

78 Claims, 17 Drawing Sheets

SHOWER HEAD OF A WAFER TREATMENT APPARATUS HAVING A GAP CONTROLLER

BACKGROUND OF THE INVENTION

1. Field of the Invention

The present invention relates to an apparatus for manufacturing a semiconductor device. More particularly, the present invention relates to a shower head provided to supply a reactant gas using plasma to a reaction chamber in a wafer treatment apparatus.

2. Description of the Related Art

As the integration density of semiconductor devices increases, a design rule decreases and the diameter of a wafer increases. Large wafers often undergo multiple steps for fabricating semiconductor devices, including, for example, deposition processes for depositing material layers on a wafer or etch processes for etching material layers on the wafer in a predetermined pattern by supplying a reactant gas from the upper portion of a reaction chamber for depositing or etching the wafer. In particular, as wafer sizes increase, during etch processes, it is important to optimize uniformity in etch rates over the entire wafer surface.

In a typical etching apparatus, a reactant gas, which is required for etching, is introduced into a reaction chamber by a downstream method whereby the gas is supplied from an upper electrode and pumped out into the periphery of a lower electrode. In order to evenly distribute the reactant gas within the reaction chamber, a shower head including several baffles, each of which has a plurality of through holes, is installed at the upper part of the reaction chamber. In a conventional shower head, the respective positions of the through holes and a gap between the baffles are fixed.

The function of the baffles provided in the shower head is to control the distribution of a flow of gas within an upper electrode, i.e., a gas distribution plate (GDP), of the etching apparatus. Typically, a gas distribution function of the baffle is determined by the gap between the baffles and an opening ratio of the through holes formed in each of the baffles. However, since the respective positions of the through holes provided in each baffle and the gap between the baffles are fixed in the conventional shower head, distribution in etch rates varies over the entire wafer surface each time a process to be performed in an etching apparatus is changed. Thus, the configuration of the conventional shower head involves limitations in developing a new process. Furthermore, development of a new etching apparatus usually requires numerous simulation processes and significant expense.

For example, in the case of an etch process for forming a gate electrode on a wafer, it may not be desirable to obtain etching uniformity over the entire wafer surface during an etch process step for forming an etch mask layer before gate patterning. Furthermore, if an etch process including multiple steps is performed, uniformity in etch rate on the wafer varies from one step to another. However, in the conventional shower head in which the respective positions of the through holes provided in each baffle and the gap between the baffles are fixed, it is impossible to supply different amounts of gas to different positions on the wafer, thereby increasing the difficulty to optimize the uniformity of a pattern to be formed over the entire wafer surface. Problems associated with an unevenness in an etch rate during an etch process during a fabrication process for a semiconductor device adversely affect the performance of the device and yields.

SUMMARY OF THE INVENTION

In an effort to solve the above problems, it is a feature of an embodiment of the present invention to provide a shower head capable of controlling the distribution amount of a reactant gas depending on a position on a wafer in order to obtain optimum uniformity in etch rate over the entire wafer surface during a fabrication process for a semiconductor device.

It is another feature of an embodiment of the present invention to provide a shower head capable of controlling the amount of a reactant gas supplied depending on a position on a wafer as desired by compensating for degradation of etch rate uniformity which may occur depending on the position on the wafer during an etch step so that a final etch rate uniformity may be optimized.

Accordingly, to provide the above features, the present invention provides a shower head for controlling the distribution amount of a reactant gas at a process region within a reaction chamber. In a shower head according to a first aspect of the present invention, a top plate has a gas port for introducing the reactant gas supplied from an outside source into the reaction chamber. A face plate, having a plurality of through holes, is disposed opposite the process region. A first baffle plate, having a plurality of through holes, is disposed between the top plate and the face plate so that it is capable of moving up or down. The first baffle plate has a top surface that defines a first gap for forming a first lateral flow passage of the reactant gas. A second baffle plate, having a plurality of through holes, is disposed between the first baffle plate and the face plate so that it is capable of moving up or down. The second baffle plate has a top surface that defines a second gap for forming a second lateral flow passage of the reactant gas between the first and second baffle plates. A gap controller is used to determine the width of the first gap and the width of the second gap.

Preferably, the plurality of through holes formed in the first baffle plate includes a plurality of first through holes formed at a first position which is proximate to a central axis of the first baffle plate and spaced apart in a radial direction from the central axis by a first distance; and a plurality of second through holes formed at a second position which is proximate to an edge of the first baffle plate and spaced apart in a radial direction from the central axis by a second distance greater than the first distance.

The gap controller preferably determines the position of the first baffle plate to decrease the width of the first gap so that the amount of the reactant gas flowing through the plurality of first through holes is greater than the amount of the reactant gas flowing through the plurality of second through holes.

The gap controller preferably determines the position of the first baffle plate to increase the width of the first gap so that the amount of the reactant gas flowing through the plurality of second through holes is increased.

Furthermore, the gap controller preferably determines the position of the second baffle plate to increase the width of the second gap so that the amount of the reactant gas flowing through the plurality of through holes formed in the second baffle plate is made uniform over the entire process region.

The gap controller preferably determines the position of the second baffle plate to decrease the width of the second gap so that the amount of the reactant gas flowing through the plurality of through holes formed in the second baffle plate is selectively made to vary depending on a position in the process region.

In the shower head according to the first aspect of the present invention, the gap controller may include a first spacer ring disposed on top of the first baffle plate for determining the width of the first gap; and a second spacer ring disposed between the first and second baffle plates for determining the width of the second gap. The first spacer ring may be disposed on a top edge of the first baffle plate, and the second spacer ring may be disposed on a top edge of the second baffle plate. The first and second spacer rings may be composed of one or more annular rings. Preferably, at least one of the first and second spacer rings may have an annular contact portion in which a plurality of sawtooth gears are formed. Each of the plurality of sawtooth gears may have a pitch corresponding to the length of an arc of a central angle 90°. Additionally, the height of each sawtooth gear of the annular contact portion is in the range of approximately 0.01–0.5 mm. The first spacer ring may have an annular contact portion comprised of a plurality of sawtooth gears formed opposite the first baffle plate. In this case, the first baffle plate includes a spacer ring coupler having a plurality of sawtooth gears formed opposite the first spacer ring to mesh with the plurality of sawtooth gears of the annular contact portion. The first spacer ring may have an annular contact portion including a plurality of sawtooth gears formed opposite the first baffle plate, and the first baffle plate may include a spacer ring coupler having a plurality of sawtooth gears formed opposite the first spacer ring to mesh with the plurality of sawtooth gears of the annular contact portion.

Alternatively, the second spacer ring may have an annular contact portion comprised of a plurality of sawtooth gears formed opposite the second baffle plate. In this case, the second baffle plate comprises a spacer ring coupler having a plurality of sawtooth gears formed opposite the second spacer ring to mesh with the plurality of sawtooth gears of the annular contact portion.

In the shower head according to the first aspect of the present invention, the first baffle plate may include a single disk-type element having a uniform thickness over the entire surface.

In the shower head according to the first aspect of the present invention, the first baffle plate may include a disk-like base plate having a plurality of through holes and a groove for providing a circular space at the center of a top surface thereof; and a disk-like insert plate inserted to rotate about a central axis of the first baffle plate within the groove, the disk-like insert plate having a plurality of through holes that are in communication with selected ones of the plurality of through holes formed in the base plate.

The plurality of through holes formed in the base plate may include: a plurality of first through holes formed at a first position that is proximate to the central axis of the first baffle plate and spaced apart in a radial direction from the central axis by a first distance less than a radius of the insert plate; and a plurality of second through holes formed at a second position that is proximate to an edge of the base plate and spaced apart in a radial direction from the central axis by a second distance greater than the radius of the insert plate. The plurality of first through holes are in communication with the plurality of through holes formed in the insert plate depending on rotational distance of the insert plate. In order to change the opening ratio of the first through hole depending on the rotational distance of the insert plate, the plurality of through holes in the insert plate and the plurality of first through holes in the base plate may be formed selectively only in some angular ranges with respect to the central axis of the first baffle plate.

The shower head according to the first aspect of the present invention may further include a guide baffle plate disposed on the first baffle plate coaxially with respect to the first baffle plate, the guide baffle plate having an inlet for introducing the reactant gas supplied through the top plate and a plurality of outlets for flowing the reactant gas introduced through the inlet out into the first gap through a plurality of passages. In this case, the width of the first gap is defined by a bottom of the guide baffle plate and a top surface of the first baffle plate. The plurality of outlets formed in the guide baffle plate may be formed at a position spaced apart in a radial direction from a central axis of the guide baffle plate by a predetermined distance.

In the shower head including the guide baffle plate, the plurality of through holes may include: a plurality of first through holes formed at a first position which is proximate to a central axis of the first baffle plate and spaced apart in a radial direction from the central axis by a first distance; and a plurality of second through holes formed at a second position which is proximate to an edge of the first baffle plate and spaced apart in a radial direction from the central axis by a second distance greater than the first distance. The plurality of outlets formed in the guide baffle plate are formed at a position that is spaced apart in a radial direction from the central axis of the guide baffle plate by a third distance greater than the first distance and less than the second distance. Preferably, a distance between each of the plurality of outlets and each of the plurality of first through holes is less than a distance between each of the plurality of outlets and each of the plurality of second through holes.

Furthermore, in the shower head including the gate baffle plate, the gap controller may include a first spacer ring disposed between the guide baffle plate and the first baffle plate for determining the width of the first gap; and a second spacer ring disposed between the first and second baffle plates for determining the width of the second gap.

In the shower head according to the first aspect of the present invention, the gap controller may include a first driving shaft for selectively moving the guide baffle plate upwardly or downwardly in order to determine the width of the first gap; and a second driving shaft for selectively moving the first baffle plate upwardly or downwardly in order to determine the width of the second gap. The first driving shaft may be coaxially installed with the second driving shaft.

In the shower head according to the first aspect of the present invention, the gap controller may include an elevating mechanism for moving the first baffle plate upwardly or downwardly using a first stepping motor in order to determine the width of the second gap; and a rotating mechanism for moving the guide baffle plate upwardly or downwardly by a gear drive using a second stepping motor in order to determine the width of the first gap. The elevating mechanism is integrated with the rotating mechanism.

The elevating mechanism may comprise a shaft, which extends to pass through the guide baffle plate and the first baffle plate, and an outward flange disposed at one end of the shaft for moving the first baffle plate upwardly or downwardly to follow the upward or downward movement of the shaft. The rotating mechanism includes the shaft which is rotatable by power transmitted from the second stepping motor, and an external screw formed on an outer circumference of the shaft where the guide baffle plate is combined, for raising or lowering the guide baffle plate according to the rotation of the shaft. A circular space for housing the outward flange formed at the end of the shaft may be formed at the central portion of the first baffle plate. The circular space accommodates the outward flange without friction so that the rotation of the outward range does not affect the first baffle plate when the shaft is rotated by the rotating mechanism in order to raise or lower the guide baffle plate. A central hole, through which the shaft passes, may be formed at a central portion of the guide baffle plate, and an internal thread mating with the external thread of the screw of the shaft is formed on an inner wall of the central hole. The internal thread mating with the external thread of the screw may be formed in the guide baffle plate so that the guide baffle plate is moved upwardly or downwardly to follow the movement of the shaft when the shaft is moved up or down by the elevating mechanism in order to raise or lower the first baffle plate. The shower head may further include a stopper for preventing the guide baffle plate from rotating when the shaft is rotated by the rotating mechanism.

The shower head according to the first aspect of the present invention may be configured so that the first baffle plate contacts the second baffle plate so that selected ones of the plurality of through holes formed in the first baffle plate are in communication with selected ones of the plurality of through holes formed in the second baffle plate to thereby form align holes. The shower head may further include a rotating mechanism connected to the first baffle plate so that the first baffle plate rotates with respect to the second baffle plate in a predetermined angular range. The plurality of through holes formed in the first baffle plate are distributed to have different opening ratios depending on a radius from the central axis of the first baffle plate. The plurality of through holes formed in the second baffle plate are distributed to have different opening ratios depending on the distance by which the first baffle plate rotates about the central axis of the second baffle plate. The rotating mechanism changes the rotational distance of the first baffle plate in order to change the opening position of the align holes. The first baffle plate may be divided into a plurality of sectorial regions that extend in a radial direction from the central axis thereof, each sectorial region having a plurality of through holes formed only in a predetermined range spaced apart from the central axis by a selected radius. The second baffle plate may be divided into a plurality of sectorial regions that extend in a radial direction from the central axis thereof, and the plurality of sectorial regions having the plurality of through holes are arranged at regular intervals. In this configuration, the gap controller may include a driving shaft for simultaneously moving the first and second baffle plates upwardly or downwardly in order to determine the width of the first gap. The width of the second gap may be effectively zero.

In a shower head according to a second aspect of the present invention, a top plate has a gas port for introducing the reactant gas supplied from an outside source into the reaction chamber. A face plate, having a plurality of through holes, is disposed opposite the process region. A first baffle plate, having a plurality of through holes, is disposed between the top plate and the face plate. A second baffle plate, having a plurality of through holes, is disposed between the first baffle plate and the face plate.

In addition, the second baffle plate has a top surface that defines a gap for forming a lateral flow passage of the reactant gas between the first and second baffle plates. A plurality of piezoelectric elements are disposed on the second baffle plate for controlling the amount of the reactant gas through the gap. A power supply unit applies voltage to each of the plurality of piezoelectric elements.

Each of the plurality of piezoelectric elements may include a piezoelectric layer which vibrates in a thickness extensional mode according to the application of voltage, the piezoelectric layer having two main surfaces; first and second electrode layers, each of which is formed on one of the two main surfaces of the piezoelectric layer; and an insulating layer formed on the first electrode layer adjacent to the first baffle plate. The second electrode layer is constructed by the second baffle plate.

The plurality of piezoelectric elements may be formed at positions corresponding to those at which the plurality of through holes of the first baffle plate are formed.

Each of the plurality of piezoelectric elements may control the amount of the reactant gas flowing from the through holes of the first baffle plate into the gap using a thickness expansion rate of the piezoelectric element adjusted according to the level of voltage applied from the power supply unit. Also, each of the plurality of piezoelectric elements may selectively open or close the plurality of through holes using a thickness expansion rate of the piezoelectric element adjusted according to the level of voltage applied from the supply unit.

The plurality of through holes of the first baffle plate may be formed at a first position spaced apart from a central axis of the first baffle plate by a predetermined radius. One of the plurality of piezoelectric elements includes an annular element formed at a position corresponding to the first position on the second baffle plate.

The shower head according to the second aspect of the present invention may further include a third baffle plate disposed between the second baffle plate and the face plate, the third baffle plate having a plurality of through holes. The third baffle plate may be formed of high resistance material whose resistivity is sufficiently high to electrically stabilize the shower head.

In the shower head according to a third aspect of the present invention, a first baffle plate has a plurality of first and second through holes in order to selectively adjust the amount of the reactant gas supplied from an outside source according to a radius from the central axis. The plurality of first through holes are spaced apart from a central axis by a first radius and the plurality of second through holes are spaced apart from the central axis by a second radius. A second baffle plate, having a plurality of through holes, is disposed below the first baffle plate so that a gap for providing a lateral flow passage is formed between the first and second baffle plates. A gap controller moves at least one of the first and second baffle plates in order to adjust the width of the gap.

Preferably, the gap controller may include a spacer ring having a predetermined thickness disposed between the first and second baffle plates for determining the width of the gap. The spacer ring is composed of one or more annular rings.

The spacer ring may be configured to have an annular contact portion in which a plurality of sawtooth gears are formed. Each of the plurality of sawtooth gears may have a pitch corresponding to the length of an arc of a central angle 90°. The annular contact portion of the spacer ring may contact a bottom surface of the first baffle plate. In this case, a spacer ring coupler having a plurality of sawtooth gears formed to mesh with the plurality of sawtooth gears of the annular contact portion is formed on the edge of the bottom surface of the first baffle plate. The space ring coupler of the first baffle plate may have a portion having a thickness less than a thickness of a bottom central portion of the first baffle plate. Alternatively, the annular contact portion of spacer ring may contact a top surface of the second baffle plate. A spacer ring coupler having a plurality of sawtooth gears formed to mesh with the plurality of sawtooth gears of the annular contact portion is formed on the top surface of the second baffle plate. Preferably, the spacer ring coupler of the second baffle plate has a portion having a thickness less than a thickness of a top central portion of the second baffle plate.

In a shower head according to a fourth aspect of the present invention, a circular first baffle plate has a plurality of through holes. A circular second baffle plate, having a plurality of through holes, is disposed below the first baffle plate with a gap having a predetermined width interposed between the first and second baffle plates. A plurality of piezoelectric elements are disposed between the first and second baffle plates for controlling the amount of a reactant gas flowing through the plurality of through holes formed in the first baffle plate.

The plurality of through holes formed in the first baffle plate may include a plurality of first through holes formed at a position spaced apart from a central axis of the first baffle plate by a first radius; a plurality of second through holes formed at a position spaced apart from the central axis of the first baffle plate by a second radius greater than the first radius; and a plurality of third through holes formed at a position spaced apart from the central axis of the first baffle plate by a third radius greater than the second radius.

The plurality of through holes formed in the second baffle plate may include: a fourth through hole formed at a position corresponding to a central axis of the second baffle plate; a plurality of fifth through holes formed at a position spaced apart from a central axis of the second baffle plate by a fourth radius; a plurality of sixth through holes formed at a position spaced apart from the central axis of the second baffle plate by a fifth radius greater than the fourth radius; and a plurality of seventh through holes formed at a position spaced apart from the central axis of the second baffle plate by a sixth radius greater than the fifth radius.

Each of the plurality of piezoelectric elements may include an annular element disposed on the second baffle plate. Preferably, the plurality of piezoelectric elements are bonded to the second baffle plate.

The plurality of piezoelectric elements may include a first piezoelectric element disposed at a position on the second baffle plate corresponding to a position at which the plurality of first through holes of the first baffle plate are formed; a second piezoelectric element disposed at a position on the second baffle plate corresponding to a position at which the plurality of second through holes of the first baffle plate are formed; and a third piezoelectric element disposed at a position on the second baffle plate corresponding to a position at which the plurality of third through holes of the first baffle plate are formed.

The shower head according to the fourth aspect of the present invention may further include a power supply unit for applying voltage to each of the plurality of piezoelectric elements. Each piezoelectric element has a thickness expansion rate that may be adjusted according to a varying level of voltage applied from the power supply unit.

According to the present invention, the width of the gap is selectively decreased or increased by the gap controller, thereby adjusting the amount of reactant gas supplied in accordance with a position on a wafer in a process region of a reaction chamber and making the amount of the reactant gas supplied to a position on the wafer even or uneven depending on the type of application. Thus, according to the present invention, it is easier to adjust the distribution of the reactant gas depending on a position on the wafer in order to obtain optimized etch rate uniformity over the entire wafer surface during the fabrication process of a semiconductor device. Furthermore, the present invention makes it possible to freely adjust the amount of reactant gas supplied, thereby compensating in advance for degradation in etch rate uniformity that may partially occur on the wafer during an etch step.

These and other features and aspects of the present invention will be readily apparent to those of ordinary skill in the art upon review of the detailed description that follows.

BRIEF DESCRIPTION OF THE DRAWINGS

The above features and advantages of the present invention will be readily apparent to those of ordinary skill in the art upon review of the detailed description that follows with reference to the attached drawings in which.

DETAILED DESCRIPTION OF THE INVENTION

Korean Patent Application No. 2001-42822, filed on Jul. 16, 2001, and entitled: "Shower Head of Wafer Treatment Apparatus Having Gap Controller," is incorporated by reference herein in its entirety.

Figure 1:
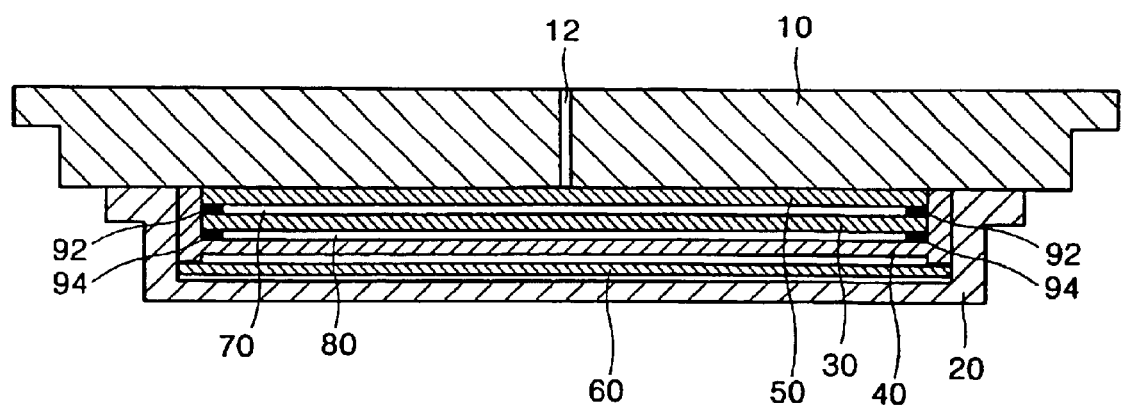
FIG. 1 illustrates a cross-sectional view schematically showing a configuration of a shower head according to a first embodiment of the present invention.

FIG. 1 illustrates a cross-sectional view schematically showing the configuration of a shower head according to a first embodiment of the present invention used for supplying a reactant gas to a process region within a reaction chamber in order to perform plasma etching on a wafer. Referring to FIG. 1, the shower head according to the first embodiment includes a top plate 10 in which a gas port 12 for introducing a reactant gas supplied from an outside source into the reaction chamber is formed, and a face plate 20 disposed opposite the process region within the reaction chamber. The top plate 10 forms an upper wall of the reaction chamber.

Figure 2:
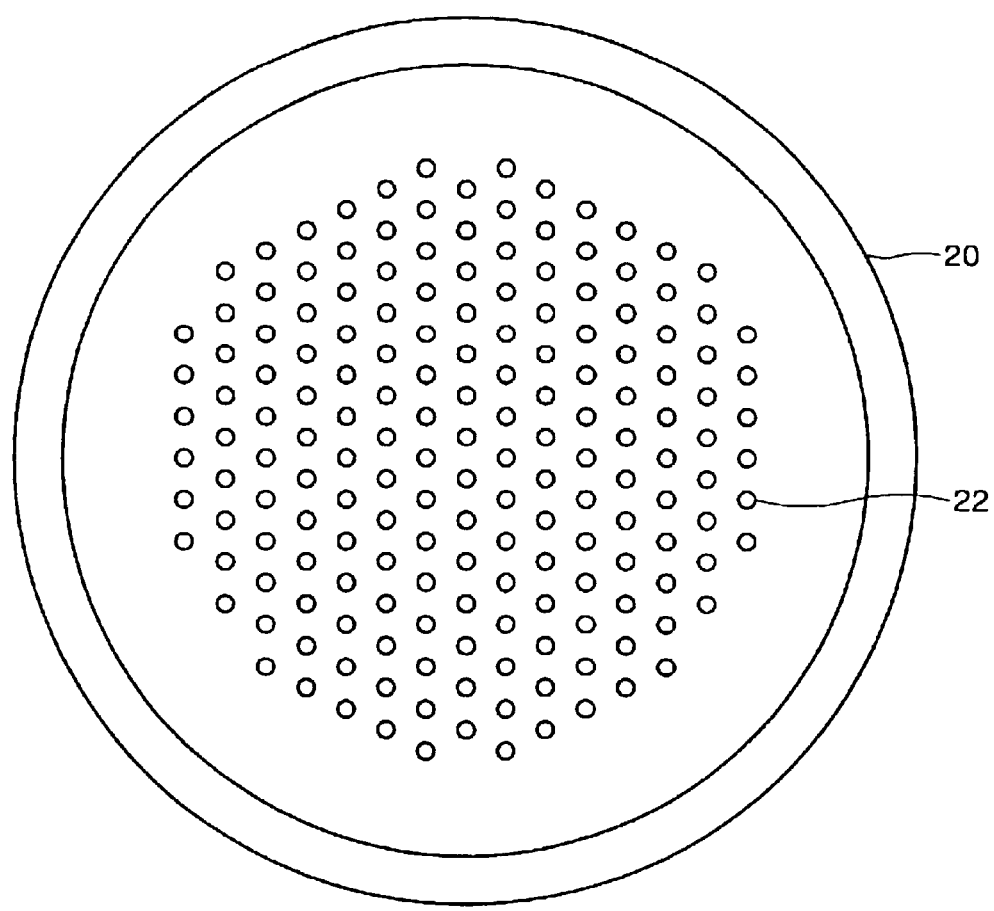
FIG. 2 illustrates a top view of a face plate provided in the shower head according to the first embodiment of the present invention.

Referring to FIG. 2, which illustrates a view of the face plate 20 when viewed from the process region of the reaction chamber, a plurality of through holes 22 are uniformly formed in the face plate 20.

Returning to FIG. 1, first and second baffle plates 30 and 40 are disposed coaxially with respect to the face plate 20 between the top plate 10 and the face plate 20. A gap controller including a first spacer ring 92 is disposed on the top surface of the first baffle plate 30, and a gap controller including a second spacer ring 94 is disposed between the first and second baffle plates 30 and 40. The first and second baffle plates 30 and 40 can be moved up or down by controlling the thicknesses of the first and second spacer rings 92 and 94, thereby determining the relative positions of the first and second baffle plates 30 and 40. The movement of the first and second baffle plates 30 and 40 will be described below in greater detail.

Figure 3:
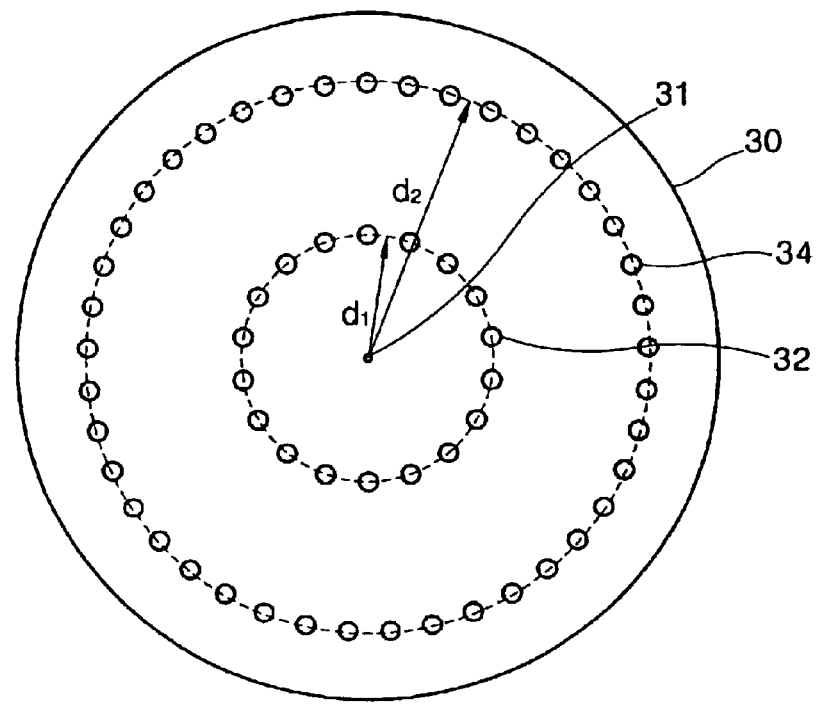
FIG. 3 illustrates a top view of a first baffle plate provided in the shower head according to the first embodiment of the present invention.
Figure 4:
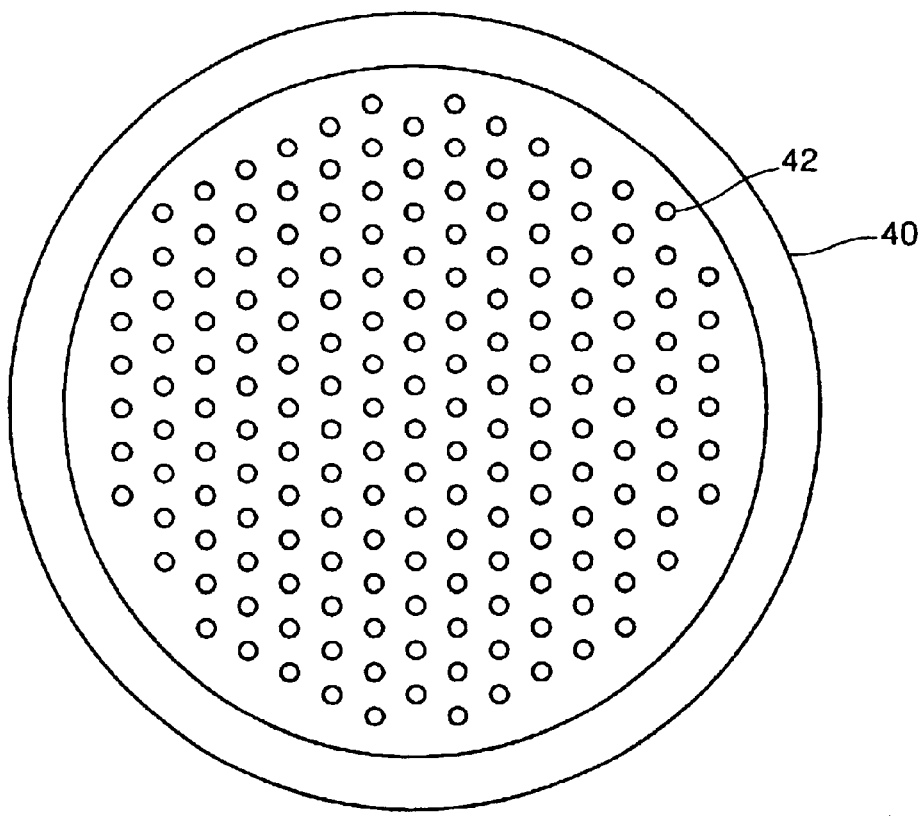
FIG. 4 illustrates a top view of a second baffle plate provided in the shower head according to the first embodiment of the present invention.

The first baffle plate 30 is formed of a single disk-type element having a uniform thickness over the entire surface thereof. A plurality of first through holes 32 and a plurality of second through holes 34 are formed in the first baffle plate 30, as shown in FIG. 3. The plurality of first through holes 32 are formed at a first position which is proximate to the central axis 31 of the first baffle plate 30 and separated in a radial direction from the central axis 31 by a first distance $d_1$. The plurality of second through holes 34 are formed at a second position which is proximate to an edge of the first baffle plate 30 and separated in a radial direction from the central axis 31 thereof by a second distance $d_2$ greater than the first distance $d_1$. As shown in FIG. 4, a plurality of through holes 42 are formed in uniform density over the entire surface of the second baffle plate 40. The first and second baffle plates 30 and 40 may be formed of aluminum.

Figure 5A:
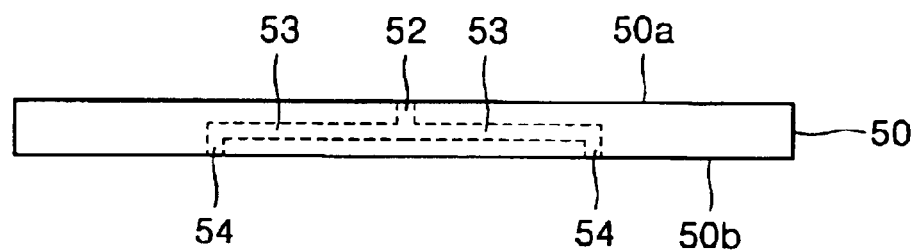
FIGS. 5A–5C illustrate a guide baffle plate provided in the shower head according to the first embodiment of the present invention.
Figure 5B:
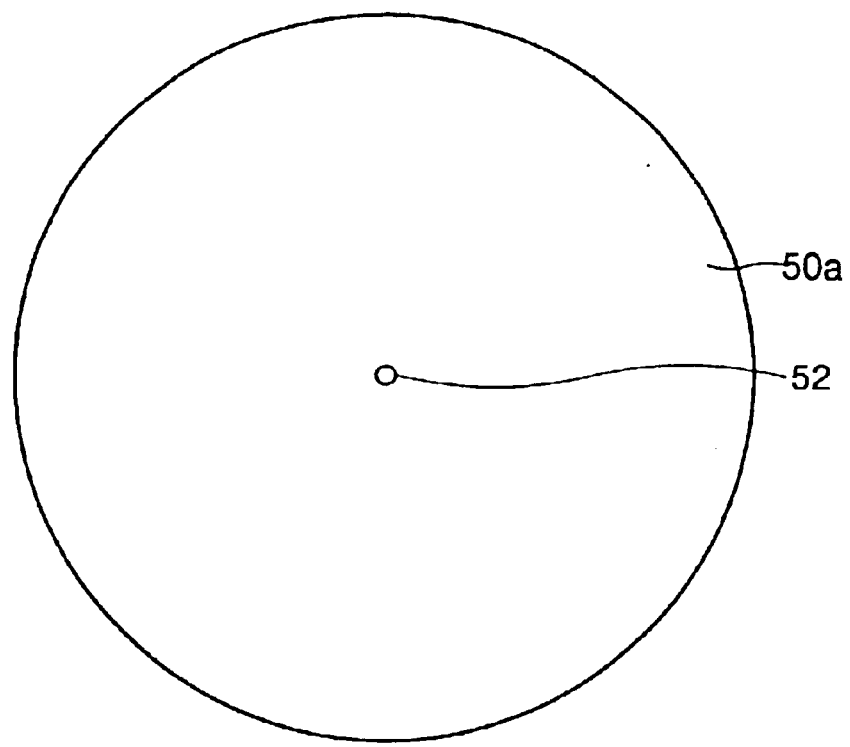
Figure 5C:
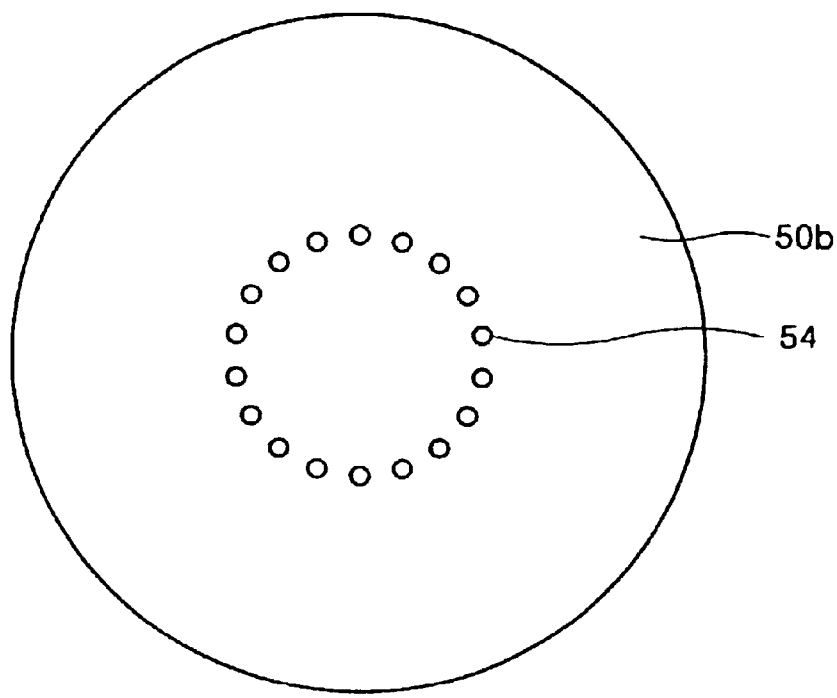

As shown in FIG. 1, a guide baffle plate 50 is disposed coaxially with respect to the first baffle plate 30 on the first baffle plate 30. The configuration of the guide baffle plate 50 are schematically shown in FIGS. 5A–5C. Referring to FIGS. 5A–5C, one inlet 52 through which a reactant gas enters the guide baffle plate 50 is formed on a top surface 50a of the guide baffle plate 50. The reactant gas, which is introduced into the guide baffle plate 50 through the inlet 52, flows through a plurality of paths 53 to a plurality of outlets 54 formed on a bottom 50b of the guide baffle plate 50.

In the thus-configured shower head, as shown in FIG. 1, a first gap 70 creating a first lateral flow path of a reactant gas introduced into the reaction chamber is formed between the first baffle plate 30 and the guide baffle plate 50. The width of the first gap 70 is limited by the bottom 50b of the guide baffle plate 50 and the top surface of the first baffle plate 30. Furthermore, a second gap 80 creating a second lateral flow path of the reactant gas is formed between the first and second baffle plates 30 and 40. The width of the second gap 80 is limited by the bottom of the first baffle plate 30 and the top surface of the second baffle plate 40.

Figure 6:
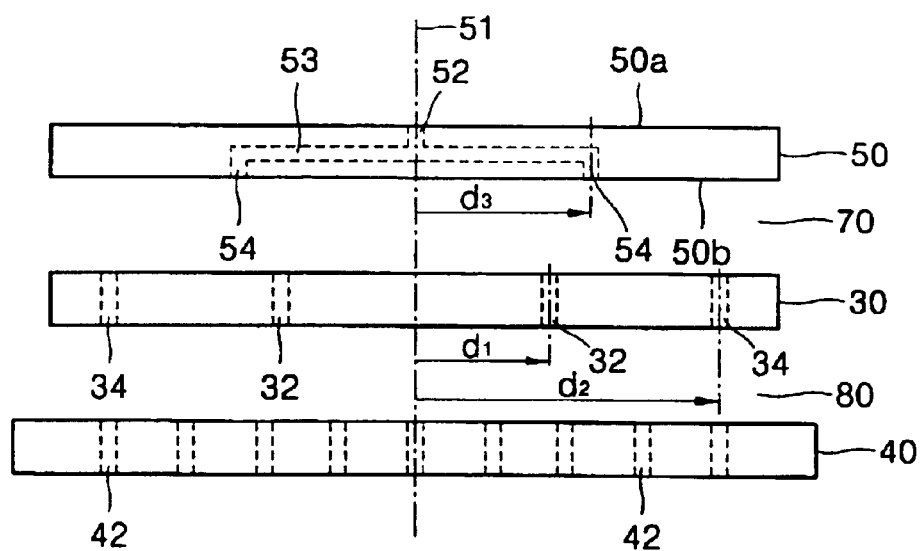
FIG. 6 illustrates the relationship among the positions of through holes formed in a guide baffle plate, a first baffle plate, and a second baffle plate.

FIG. 6 illustrates a position relationship among the through holes 54, 32, and 34, and 42 respectively formed on the guide baffle plate 50, the first baffle plate 30, and the second baffle plate 40. Referring to FIG. 6, the plurality of outlets 54 are formed at a position on the guide baffle plate 50, which is separated in a radial direction from a central axis 51 of the guide baffle plate by a third distance $d_3$. The third distance $d_3$ is greater than the first distance $d_1$, by which the first through holes 32 are separated from the central axis 51 of the guide baffle plate 50, and less than the second distance $d_2$, by which the second through holes 34 are separated from the same axis 51. Preferably, a distance between the outlet 54 of the guide baffle plate 50 and the first through hole 32 of the first baffle plate 30 is less than that between the outlet 54 and the second through hole 34. This makes it possible to selectively control the amount of gas so that the amount of gas flowing into the first through holes 32 is greater than the amount of gas flowing into the second through holes 34 or that the flow amount at the first and second through holes 32 and 34 are kept constant by adjusting the width of the first gap 70 formed between the guide baffle plate 50 and the first baffle plate 30. That is, since the outlet 54 is closer to the first through holes 32, it is easier to introduce a reactant gas from the outlet 54 into the first through holes 32 as the first gap 70 becomes narrower, so that the amount of gas flowing through the first through holes 32 is greater than the amount of gas flowing through the second through holes 34. Thus, a greater amount of reaction gas can be supplied to a central portion on the wafer than to an edge thereof. On the other hand, as the width of the first gap 70 increases, the amount of a reaction gas discharged and diffused to the second through holes 34 through the outlet 54 increases, thus increasing the amount of reaction gas flowing through the second through holes 34.

Figure 7:
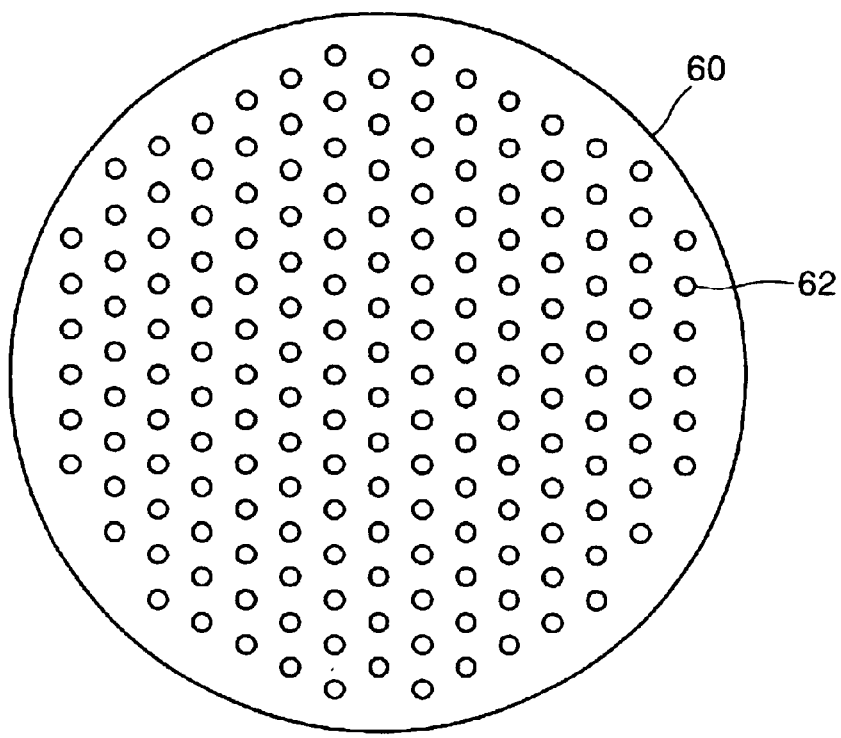
FIG. 7 illustrates a top view of a third baffle plate provided in a shower head according to the first embodiment of the present invention.

In order to electrically stabilize the shower head, a third baffle plate 60 is disposed between the second baffle plate 40 and the face plate 20. The third baffle plate 60 may be formed of high resistance material whose resistivity is sufficiently high to electrically stabilize the shower head, for example, silicon carbide (SiC). As shown in FIG. 7, a plurality of through holes 62 are formed in uniform density over the entire surface of the third baffle plate 60.

The width of the first gap 70 is determined by the first spacer ring 92, which is the gap controller disposed on the top edge of the first baffle plate 30 between the guide baffle plate 50 and the first baffle plate 30. The width of the second gap 80 is determined by the second spacer ring 94, which is the gap controller disposed on the top edge of the second baffle plate 40 between the first and second baffle plates 30 and 40.

Figure 8:
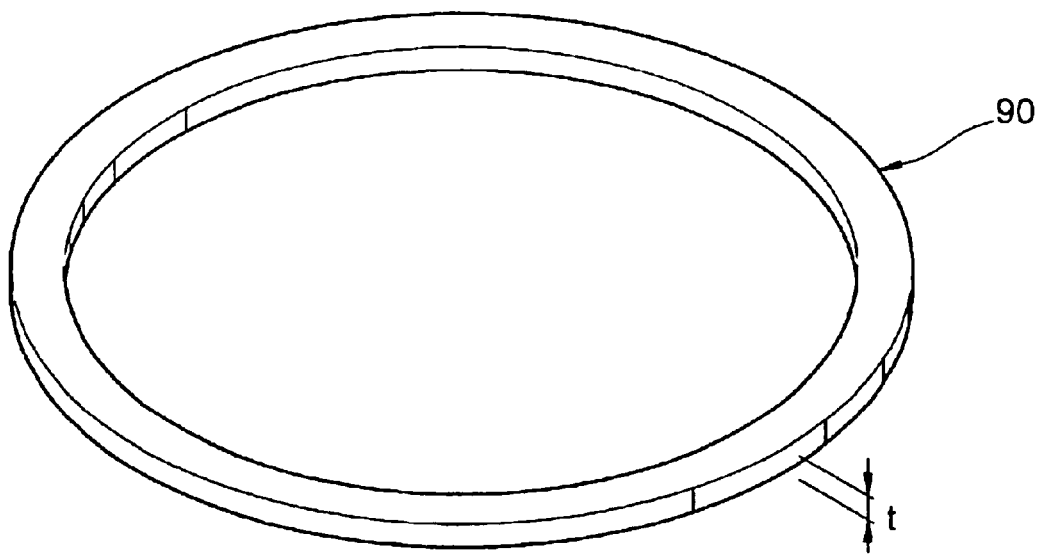
FIG. 8 illustrates a perspective view of an annular ring that is an example of a gap controller adopted in a shower head according to an embodiment of the present invention.

FIG. 8 illustrates a perspective view of an annular ring 90, which is an implementation example of the first or second spacer ring 92 or 94. The thickness of the first or second spacer ring 92 or 94 is determined by the thickness t of the annular ring 90. In order to adjust the widths of the first and second gaps 70 and 80 to a desired extent, the first or second spacer rings 92 and 94 may include only one annular ring 90 having a desired thickness, or two or more annular rings 90 having a predetermined thickness that overlap one another by a desired thickness.

The position of the first baffle plate 30 and the width of the first gap 70 may be determined by the thickness of the first spacer ring 92. As the width of the first gap 70 decreases, the amount of reaction gas passing through the first through holes 32 is greater than the amount of reaction gas passing through the second through holes 34 in the first baffle plate 30. Conversely, as the width of the first gap 70 increases, the amount of reaction gas passing through the second through holes 34 in the first baffle plate 30 is increased.

Furthermore, the width of the second gap 80 formed between the first and second baffle plates 30 and 40 is determined by the thickness of the second spacer ring 94. As the width of the second gap 80 decreases, the amount of reaction gas passing through the through holes 42 positioned near the first or second through holes 32 or 34 of the first baffle plate 30 among the plurality of through holes 42 is increased, thereby making the amount of reaction gas passing through the plurality of through holes 42 selectively uneven depending on a position within the process region. Conversely, as the width of the second gap 80 increases to a sufficient extent, the amount of reaction gas passing through the plurality of through holes 42 may be made uniform over the entire process region.

Figure 9A:
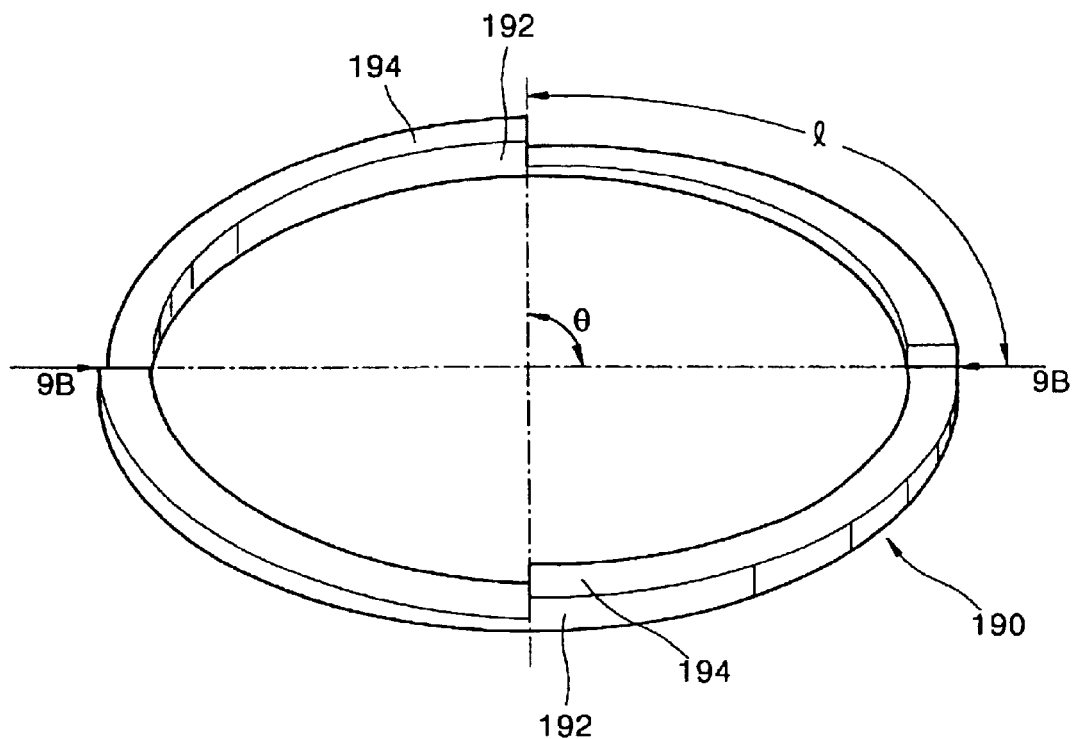
FIGS. 9A and 9B illustrate an annular ring that is another example of a gap controller adopted in a shower head according to an embodiment of the present invention.
Figure 9B:
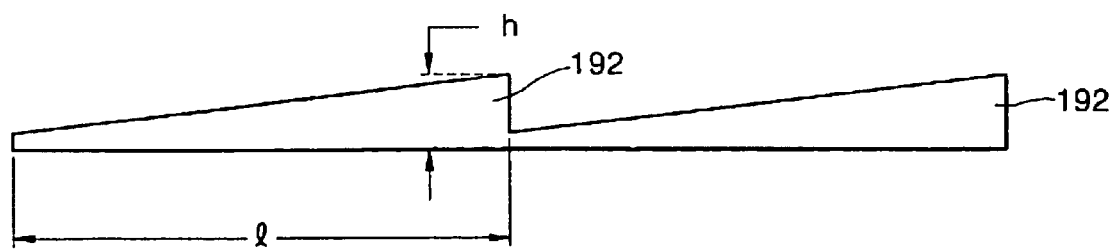

FIG. 9A illustrates a perspective view of an annular ring 190 having an annular contact portion 194 in which a plurality of sawtooth gears 192 are formed, which is another implementation example of the first or second spacer ring 92 or 94. FIG. 9B illustrates a side view of the annular ring 190 taken along its full length between 9B—9B of FIG. 9A.

Referring to FIGS. 9A and 9B, the sawtooth gears 192 are designed to have a pitch that is the same as the length e of an arc of a central angle (θ) 90°. The height h of the sawtooth gears 192 formed on the annular contact portion 194 is on the order of approximately 0.01–0.5 mm.

If the first spacer ring 92 in the first gap 70 is comprised of the annular ring 190, the annular contact portion 194 on which the plurality of sawtooth gears 192 are formed may be disposed opposite the first baffle plate 30 or the guide baffle plate 50. If the annular contact portion 194 is disposed opposite the first baffle plate 30 within the first gap 70, a spacer ring coupler meshing with the sawtooth gear 192 is formed on the surface of the first baffle plate 30 opposite the first spacer ring 92 comprised of the annular ring 190.

Figure 10:
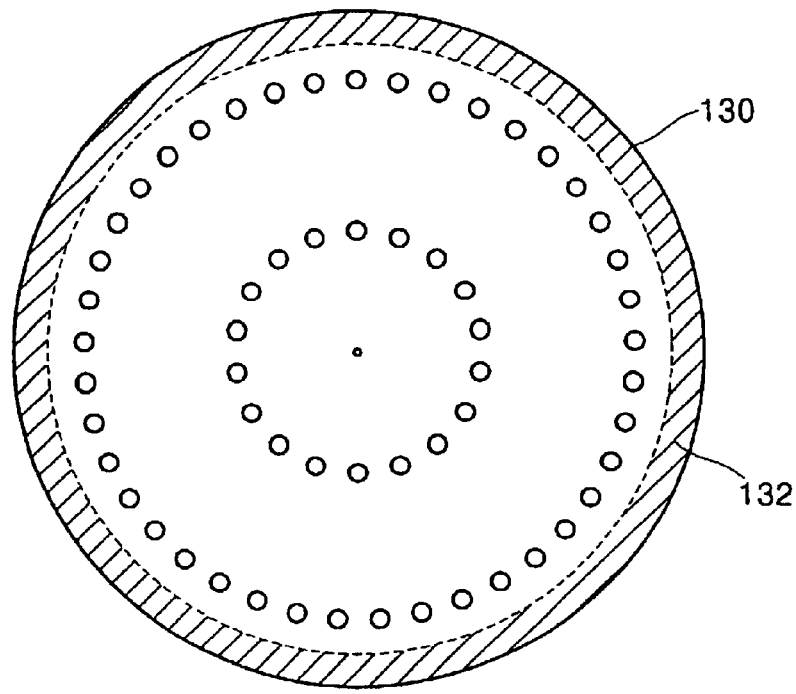
FIG. 10 illustrates a top view of an example of a modified first baffle plate that can be adopted in a shower head according to an embodiment of the present invention.

FIG. 10 illustrates a modified first baffle plate 130 on which a spacer ring coupler 132 for connecting with the annular contact portion 194 has been formed. A plurality of sawtooth gears (not shown) that mesh with the plurality of sawtooth gears 192 of the annular contact portion 194 are formed on the spacer ring coupler 132. Like in the annular ring 190, the sawtooth gears formed on the spacer ring coupler 132 are designed to have a pitch that is the same as the length of an arc of a central angle 90°. The height of the sawtooth gears formed on the spacer ring coupler 132 is on the order of approximately 0.01–0.5 mm.

Furthermore, if the second spacer ring 94 in the second gap 80 is comprised of the annular ring 190, the annular contact portion 194 on which the plurality of sawtooth gears 192 are formed may be disposed opposite the first or second baffle plate 30 or 40. If the annular contact portion 194 is disposed opposite the second baffle plate 40 within the second gap 80, a spacer ring coupler meshing with the sawtooth gear 192 is formed on the surface of the second baffle plate 40 opposite the second spacer ring 94 comprised of the annular ring 190.

Figure 11:
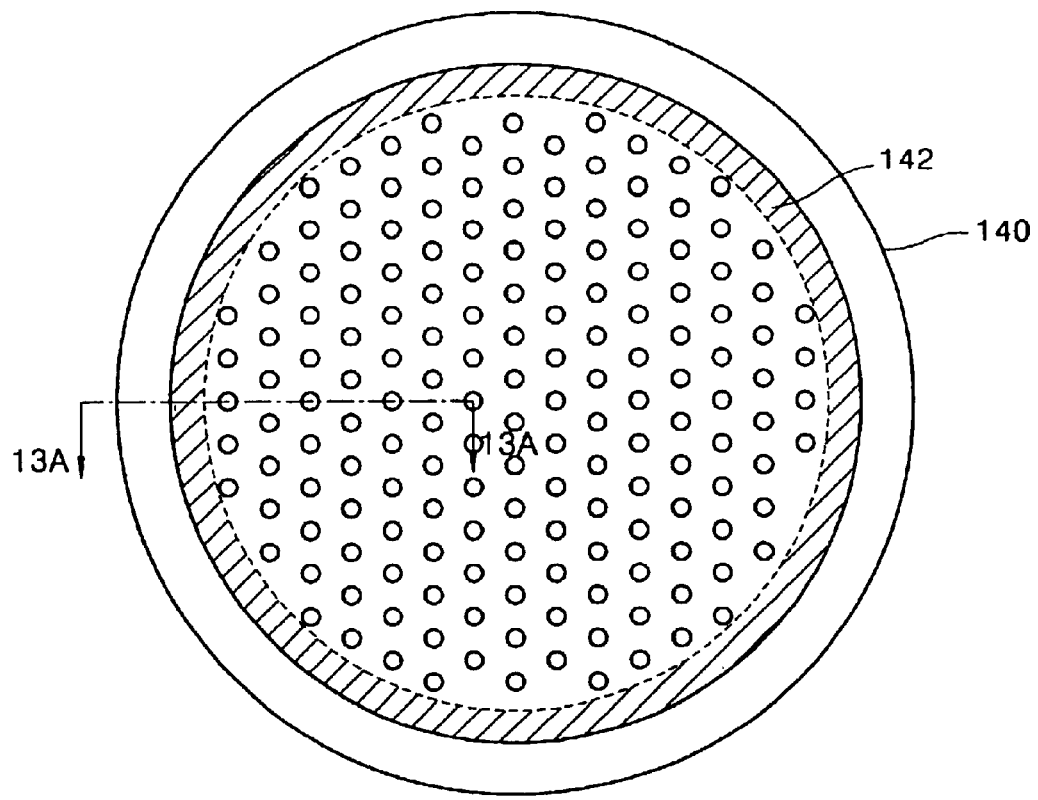
FIG. 11 illustrates a top view of a modified second baffle plate that can be adopted in a shower head according to an embodiment of the present invention.

FIG. 11 illustrates a modified second baffle plate 140 on which the spacer ring coupler 142 for connecting with the annular contact portion 194 has been formed. A plurality of sawtooth gears (not shown) that mesh with the plurality of sawtooth gears 192 of the annular contact portion 194 are formed on the spacer ring coupler 142. Like in the annular ring 190, the sawtooth gears formed on the spacer ring coupler 142 are designed to have a pitch that is the same as the length of an arc of a central angle 90°. The height of the sawtooth gears formed on the spacer ring coupler 142 is on the order of approximately 0.01–0.5 mm.

Figure 12A:
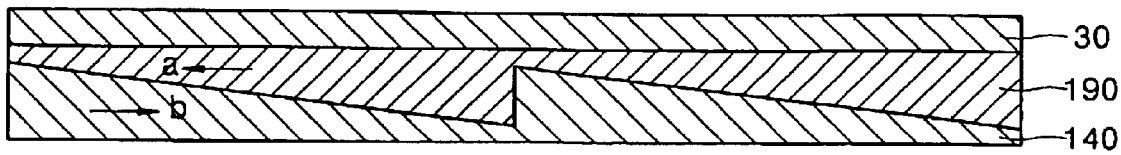
FIGS. 12A and 12B illustrate a method for controlling the width of a second gap using the annular ring of FIG. 9A.
Figure 12B:
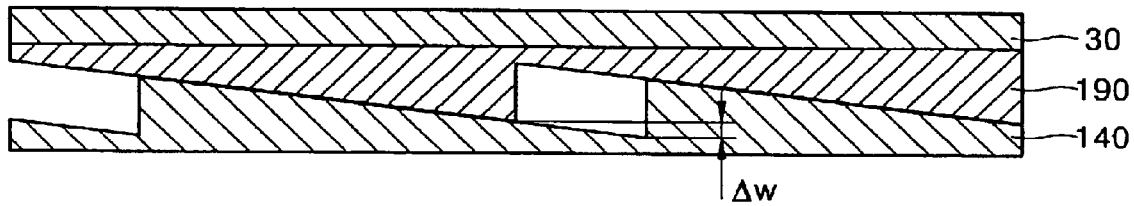

FIGS. 12A and 12B illustrate partial diagrammatic views of a shower head for explaining a method for controlling the width of the second gap 80 using the annular ring 190 when the second spacer ring 94 disposed between the first baffle plate 30 and the modified second baffle plate 140 is comprised of the annular ring 190. FIG. 12A illustrates a state in which the second gap 80 has the smallest width. If the annular ring 190 rotates in a direction indicated by arrow 'a' or the modified second baffle plate 140 rotates in a direction indicated by arrow 'b' in the state shown in FIG. 12A, the width of the second gap 80 is increased by Δw according to its rotation distance, as shown in FIG. 12B. Thus, the width of the second gap 80 is adjusted to a desired extent by controlling the rotation distance of the annular ring 190 or the modified second baffle plate 140.

Figure 13A:
FIGS. 13A and 13B illustrates cross-sectional views taken along line 13A—13A of FIG. 11.
Figure 13B:
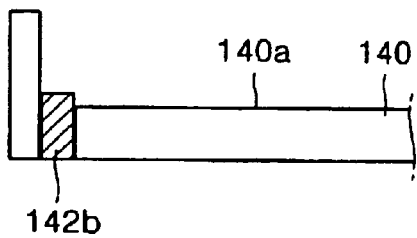

FIGS. 13A and 13B illustrates cross-sectional views taken along line 13A—13A of FIG. 11 for explaining the spacer ring coupler 142 of the modified second baffle plate 140. Referring to FIG. 13A, a low stepped portion 142a of the spacer ring coupler 142 on the modified second baffle plate 140, at which adjacent two saw tooth gears meet each other, is thinner than a top central portion 140a of the modified second baffle plate 140. Referring to FIG. 13B, a highest toothed portion 142b of each saw tooth gear of the spacer ring coupler 142 on the modified second baffle plate 140 is thicker than the top central portion 140a of the modified second baffle plate 140.

In order to control the width of the second gap 80 using the annular ring 190, if the annular contact portion 194 of the annular ring 190 is disposed opposite the first baffle plate 30, a spacer ring coupler having the same configuration as the spacer ring coupler 142 formed on the top edge of the modified second baffle plate 140 is formed on a bottom edge of the first baffle plate 30. Explanation of the detailed configuration of the spacer ring coupler will be omitted since it is similar to that of the spacer ring coupler 142 of the modified second baffle plate 140. The difference is that if the annular contact portion 194 of the annular ring 190 is disposed opposite the first baffle plate 30, the annular contact portion 194 contacts the bottom of the first baffle plate 30 and the spacer ring coupler of the first baffle plate 30 has a portion with a thickness less than the thickness of a bottom central portion of the first baffle plate 30.

Although the present invention has been described with respect to the controlling of the width of the second gap 80 using the annular ring 190, it will be understood by those of ordinary skill in the art that the above configurations or arrangements may be applied in the same manner to the controlling of the width of the first gap 70 using the annular ring 190.

In the above embodiment, the first baffle plate 30 is formed of a single disk-type element having a uniform thickness over the entire surface. However, the first baffle plate 30 may be configured in various ways depending on the type of application.

Figure 14A:
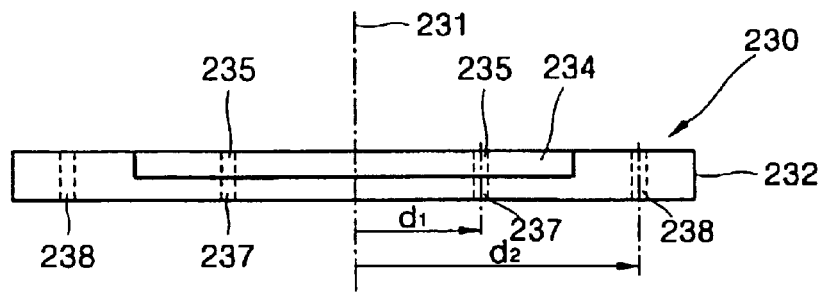
FIGS. 14A and 14B illustrate a cross-sectional view and a perspective view of another example of a modified first baffle plate that can be adopted in a shower head according to an embodiment of the present invention, respectively.
Figure 14B:
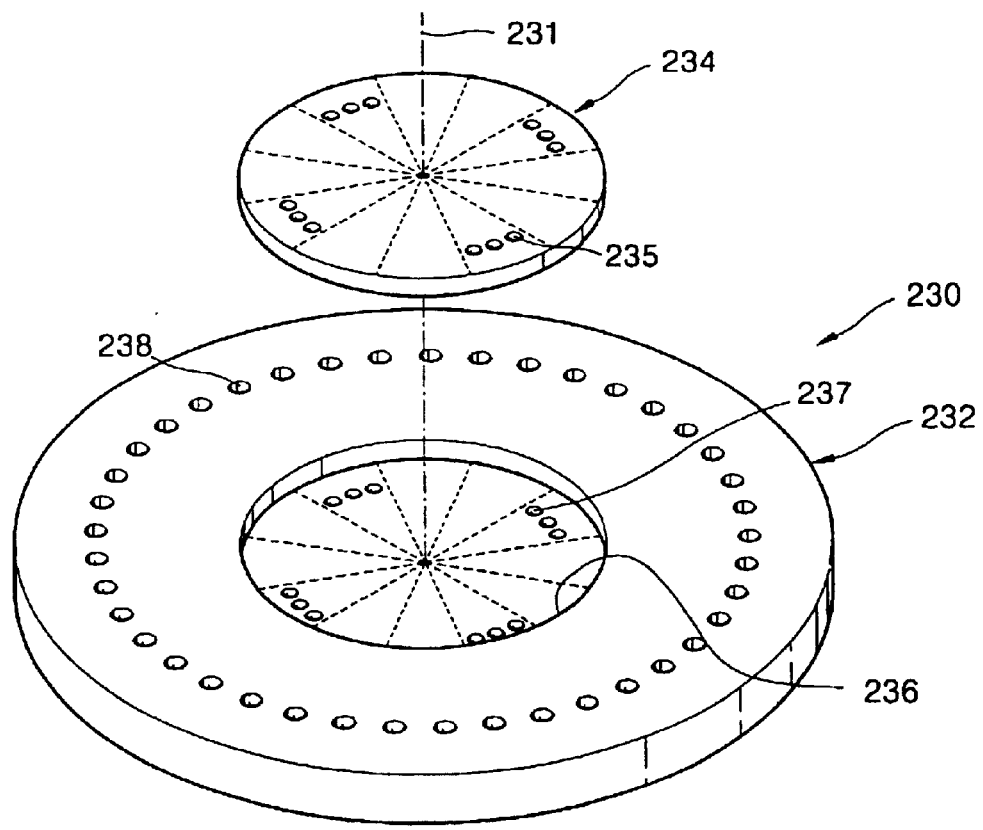

FIGS. 14A and 14B illustrate a configuration of a modified first baffle plate 230. FIG. 14A illustrates a cross-sectional view taken along a central axis 231 of the modified first baffle plate 230. FIG. 14B illustrates an exploded perspective view of the modified first baffle plate 230.

Referring to FIGS. 14A and 14B, the modified first baffle plate 230 includes a disk-like base plate 232 having a groove 236 for providing a circular space at the center of the top surface thereof, and a disk-like insert plate 234 inserted into the groove 236 so that it can rotate about the central axis 231 of the modified first baffle plate 230 within the groove 236. The insert plate 234 is connected to a driving device (not shown) for rotating the insert plate 234 at a predetermined angle. The base plate 232 has a plurality of first through holes 237 and a plurality of second through holes 238. The plurality of first through holes 237 are formed at a first position which is in close proximity to the central axis 231 of the modified first baffle plate 230 and separated in a radial direction from the central axis 231 by a first distance $d_1$ less than the radius of the insert plate 234. The plurality of second through holes 238 are formed at a second position which is in close proximity to an edge of the base plate 232 and separated in a radial direction from the central axis 231 by a second distance $d_2$ greater than the radius of the insert plate 234. The insert plate 234 has a plurality of through holes 235 that may be in communication with the plurality of first through holes 237 formed on the base plate 232. In order to change the opening ratio of the first through holes 237 depending on rotational distance of the insert plate 234, the plurality of through holes 235 in the insert plate 234 and the plurality of first through holes 237 in the base plate 232 are formed selectively only in some angular ranges with respect to the central axis 231 of the modified first baffle plate 230. That is, all or some of the through holes 235 formed in the insert plate 234 may be in communication with the first through holes 237 formed in the base plate 232 depending on the rotational distance of the insert plate 234.

By adopting the modified first baffle plate 230 having the configuration as described above, the opening ratio of the first through holes 237 formed on the base plate 232 is changed depending on the rotation distance of the insert plate 234, thereby adjusting the amount of reactant gas supplied from the process region of the reaction chamber to a central portion on the wafer.

Figure 15:
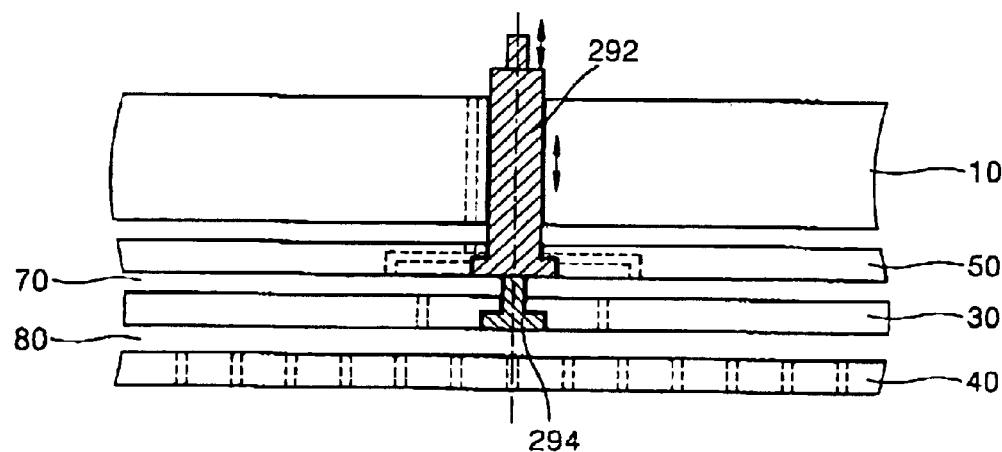
FIG. 15 schematically illustrates the configuration of main parts of a shower head according to a second embodiment of the present invention.

FIG. 15 schematically illustrates a configuration of main parts of a shower head according to a second embodiment of the present invention. The second embodiment is similar to the first embodiment except for the fact that first and second driving shafts 292 and 294 are used as a gap controller for determining the first and second gaps 70 and 80. In the embodiment shown in FIG. 15, the gap controller includes first and second driving shafts 292 and 294. The first driving shaft 292 selectively moves the guide baffle plate 50 up or down in order to determine the width of the first gap 70. The second driving shaft 294 selectively moves the first baffle plate 30 up or down in order to determine the width of the second gap 80. The second driving shaft 294 is disposed coaxially with respect to the first driving shaft 292. The distance by which the guide baffle plate 50 or the first baffle plate 30 is moved up or down is adjusted relative to each other, thereby determining the width of the first or second gap 70 or 80. The width of the first or second gap 70 or 80 is determined by considering the amount of a reaction gas to be supplied to the center portion or edge of the wafer from the process region of the reaction chamber. The first and second driving shafts 292 and 294 are used to determine the widths of the first and second gaps 70 and 80, respectively, thereby freely adjusting the amount of reaction gas to be supplied from the process region to the central portion or edge of the wafer. Furthermore, this makes the amount of reaction gas supplied even or uneven over the entire wafer surface depending on the type of application.

Figure 16A:
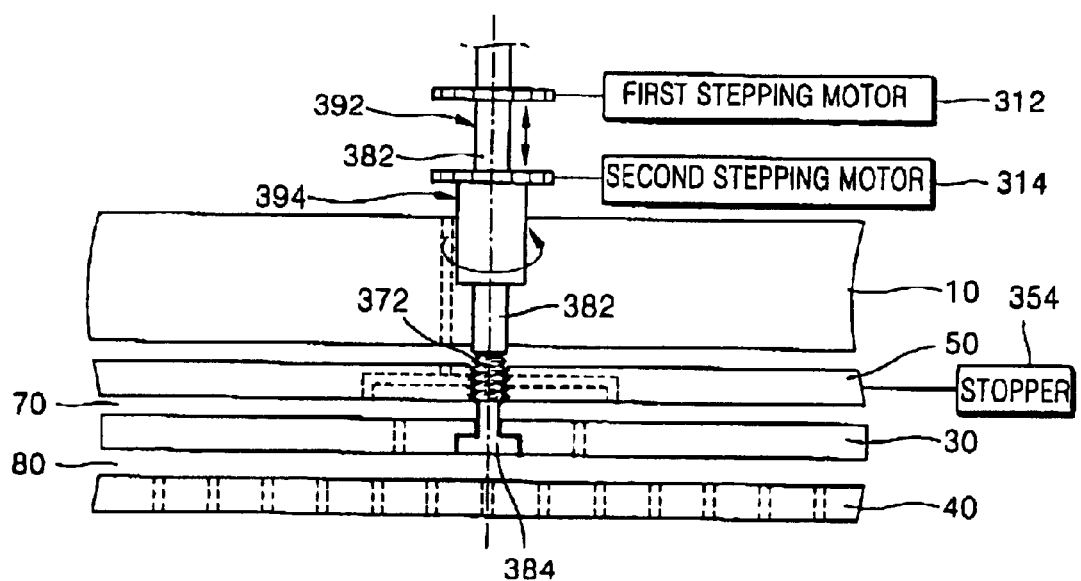
FIGS. 16A–16C schematically illustrate the configuration of main parts of a shower head according to a third embodiment of the present invention.
Figure 16B:
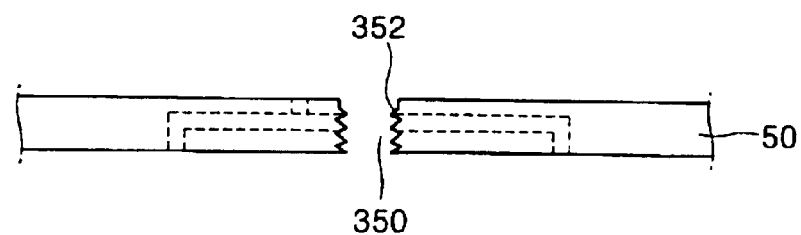
Figure 16C:
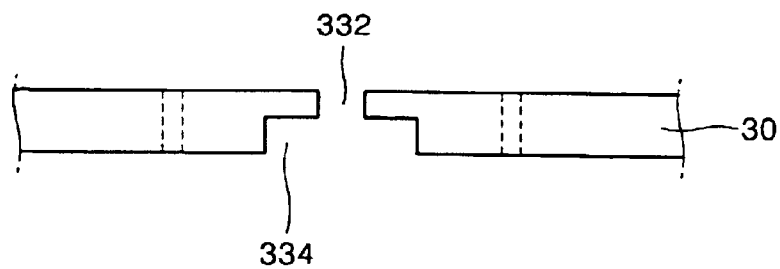

FIGS. 16A–16C schematically illustrates a configuration of main parts of a shower head according to a third embodiment of the present invention. Referring to FIG. 16A, an elevating mechanism 392 and a rotating mechanism 394 are used as a gap controller for determining the first and second gaps 70 and 80. Parts of the shower head in this embodiment other than the elevating mechanism 392 and the rotating mechanism 394 have the same configuration as described in the above embodiments. The elevating mechanism 392 drives the first baffle plate 30 upwardly or downwardly using a first stepping motor 312 in order to determine the width of the second gap 80. The rotating mechanism 394 drives the guide baffle plate 50 upwardly or downwardly by means of a gear drive using the second stepping motor 314.

The elevating mechanism 392 is integrated with the rotating mechanism 394 as shown in FIG. 16A. The elevating mechanism 392 is movable up or down by power transmitted from the first stepping motor 312. The elevating mechanism 392 includes a shaft 382 that extends to penetrate the guide baffle plate 50 and the first baffle plate 30 and an outward flange 384 formed at one end of the shaft 382 for driving the first baffle plate 30 upwardly or downwardly to follow the upward or downward movement of the shaft 382.

The rotating mechanism 394 includes the shaft 382 which is rotatable by power transmitted from the second stepping motor 314, and an external screw 372, formed at a position on an outer circumference of the shaft 382 where the guide baffle plate 50 is combined, for driving the guide baffle plate 50 upwardly or downwardly according to the rotation of the shaft 382

As shown in FIG. 16B, a central hole 350, through which the shaft 382 passes, is formed at a central portion of the guide baffle plate 50. An internal thread 352 mating with the external thread of screw 372 is formed on an inner wall of the central hole 350.

As shown in FIG. 16C, at a central portion of the first baffle plate 30, a central hole 332 penetrated by the shaft 382 is in communication with a circular space 334 for housing the outward flange 384 formed at the end of the shaft 382.

The width of the second gap 80 is adjusted using the elevating mechanism 392. In this case, if the shaft 382 is moved up or down by the elevating mechanism 392 in order to raise or lower the first baffle plate 30, the guide baffle plate 50 is raised or lowered to follow the upward or downward movement of the shaft 382 since the internal thread 352 engaging the external thread of screw 372 is formed in the guide baffle plate 50. Thus, the first baffle plate 30 and the guide baffle plate 50 are simultaneously moved upwardly or downwardly when the shaft 382 is moved up or down.

The width of the first gap 70 is adjusted using the rotating mechanism 394. If the rotating mechanism 394 is used to rotate the shaft 382, the guide baffle plate 50 is raised or lowered by interaction of the external thread of screw 372 of the shaft 382 and the internal thread 352 formed in the central hole 350 of the guide baffle plate 50. When the shaft 382 is rotated by the rotating mechanism 394 in this way, the first baffle plate 30 does not rotate but remains stationary since the circular space 334 for housing the outward flange 384 is formed in the first baffle plate 30 so that rotation of the outward flange 384 does not affect the first baffle plate 30. Here, in order to move the guide baffle plate 50 upwardly or downwardly, instead of rotating it when the shaft 382 is rotated by the rotating mechanism 394, a stopper 354 for preventing the rotation of the guide baffle plate 50 is connected to the guide baffle plate 50.

In the above configuration, the elevating mechanism 392 and the rotating mechanism 394 are used to determine the widths of the second and first gaps 80 and 70, respectively, thereby adjusting the amount of gas to be supplied from the process region to the central portion or edge of the wafer as desired or making the amount of reactant gas supplied even or uneven over the entire wafer surface depending on the type of application.

Figure 17:
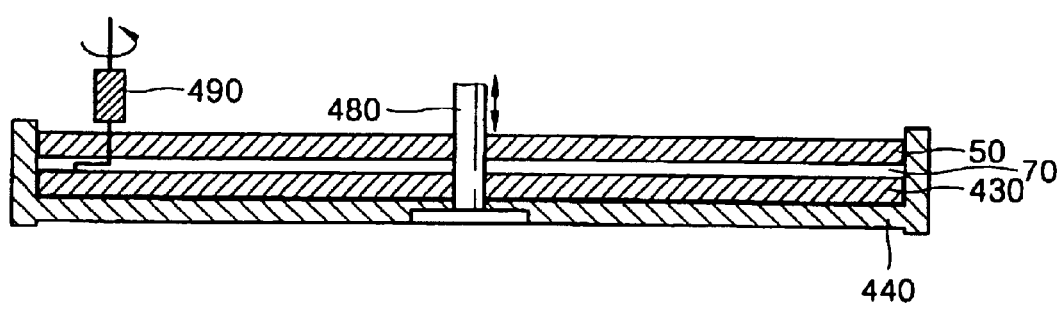
FIG. 17 schematically illustrates the configuration of main parts of a shower head according to a fourth embodiment of the present invention.

FIG. 17 schematically illustrates a configuration of main parts of a shower head according to a fourth embodiment of the present invention. In FIG. 17, the same elements are denoted by the same reference numerals, and a detailed explanation thereof will be omitted.

In the embodiment shown in FIG. 17, a first baffle plate 430 is in contact with a second baffle plate 440. Thus, the width of the second gap 80 disposed between the first and second baffle plates 430 and 440 is effectively zero. A driving shaft 480 for simultaneously driving the first and second baffle plates 430 and 440 upwardly or downwardly is disposed in order to determine the width of the first gap 70 formed between the guide baffle plate 50 and the first baffle plate 430. When the second baffle plate 440 is driven by the driving shaft 480 upwardly or downwardly, the first baffle plate 430 is moved upwardly or downwardly to follow the upward or downward movement of the second baffle plate 440, thereby limiting the width of the first gap 70 by the bottom of the baffle plate 50 and the top of the first baffle plate 430. The detailed configuration of the guide baffle plate 50 is as described above.

A rotating mechanism 490 is connected to the first baffle plate 430. The first baffle plate 430 is rotatable with respect to the second baffle plate 440 in a predetermined angular range by the rotating mechanism 490. More specifically, the rotating mechanism 490 varies an angle of rotation of the first baffle plate 430 so that the first and second baffle plates 430 and 440 contact each other with various rotational angles.

Figure 18:
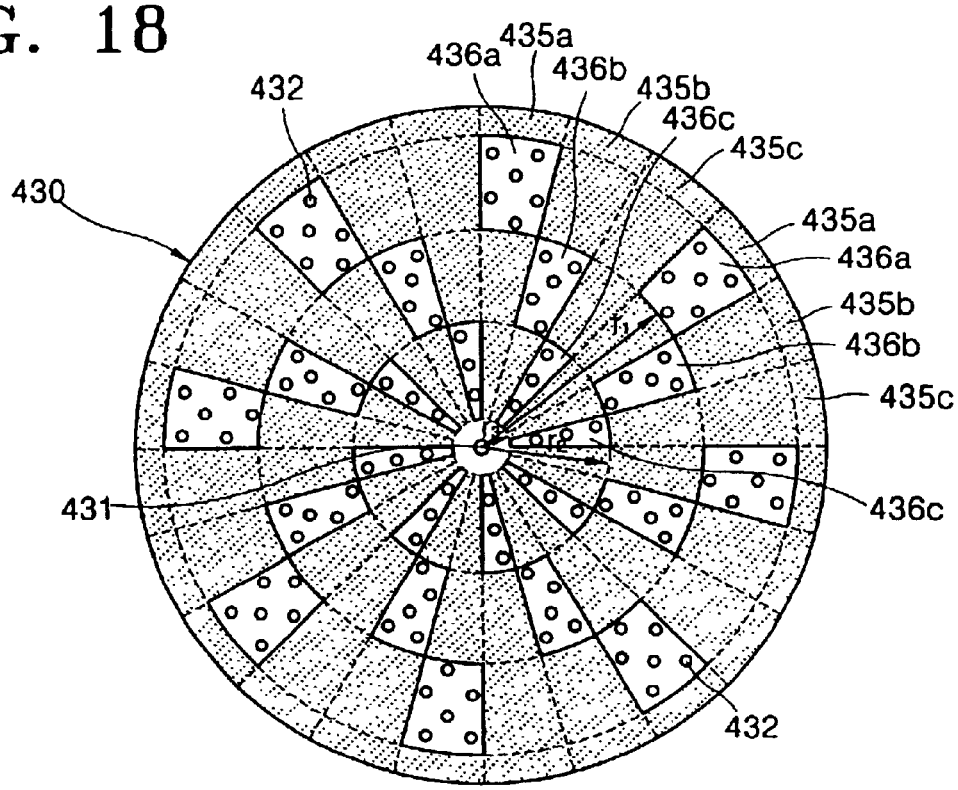
FIG. 18 illustrates a top view of the first baffle plate included in the shower head of FIG. 17.

FIG. 18 illustrates a top view of the first baffle plate 430. The first baffle plate 430 has a plurality of through holes 432. The plurality of through holes 432 are distributed to have different opening ratios depending on a radius from a central axis 431 of the first baffle plate 430.

Figure 19:
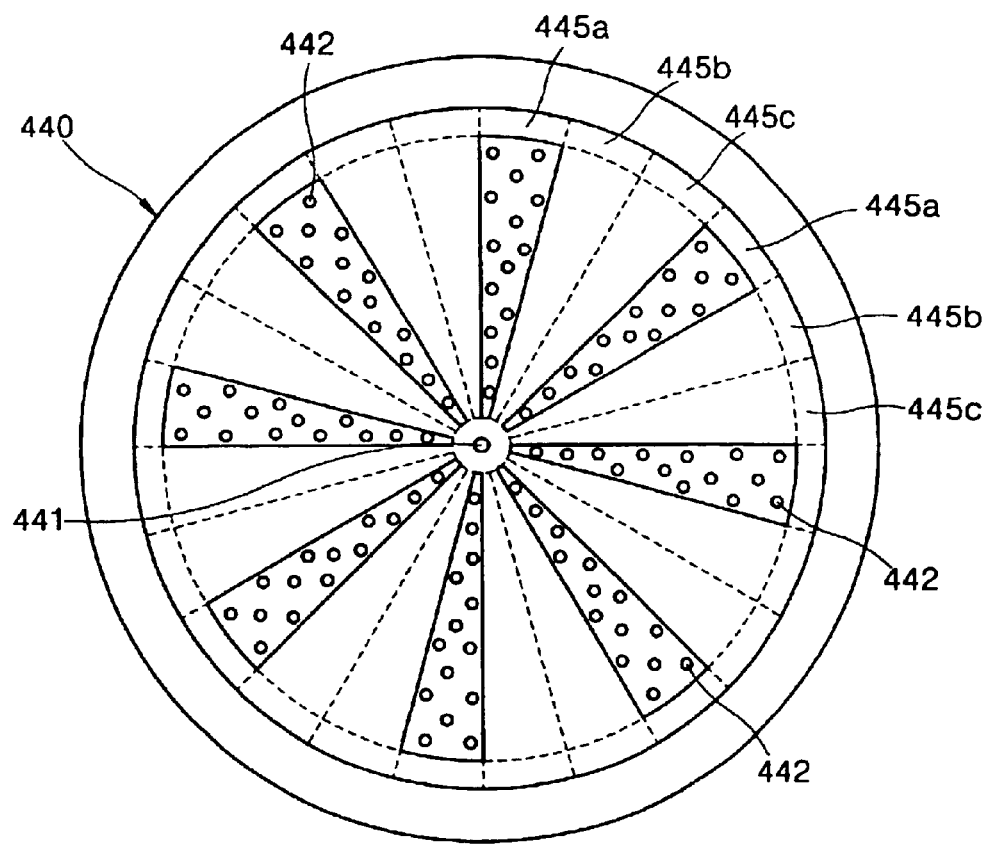
FIG. 19 illustrates a top view of the second baffle plate included in the shower head of FIG. 17.

The first baffle plate 430 is divided into a plurality of sectorial regions 435a, 435b, and 435c which extend radially from the central axis 431 thereof. Each of the plurality of sectorial regions 435a, 435b, and 435c has the plurality of through holes 432, which are formed only in a predetermined range, separated from the central axis 431 by a selected radius. That is, the sectorial region 435a has the plurality of through holes 432 formed only in a first range 436a separated from the central axis 432 by a first radius $r_1$. The sectorial region 435b has the plurality of through holes 432 formed only in a second range 436b separated from the central axis 432 by a second radius $r_2$. The sectorial region 435c has the plurality of through holes 432 formed only in a third range 436c separated from the central axis 432 by a third radius $r_3$ FIG. 19 illustrates a top view of the second baffle plate 440. The second baffle plate 440 has a plurality of through holes 442. The plurality of through holes 442 are distributed to have different opening ratios depending on the distance by which the first baffle plate 430 rotates about a central axis 441 of the second baffle plate 440.

The second baffle plate 440 is divided into a plurality of sectorial regions 445a, 445b, and 445c that extend radially from the central axis 441 thereof. Each of the plurality of sectorial regions 445a, 445b, and 445c formed on the second baffle plate 440 has a size corresponding to each of the plurality of sectorial regions 435a, 435b, and 435c formed on the first baffle plate 430. The sectorial regions 445b and 445c have an opening ratio of zero (i.e., no openings). The sectorial region 445a has a plurality of through holes 442 arranged at regular intervals.

Since the first and second baffle plates 430 and 440 contact each other as shown in FIG. 17, selected ones of the plurality of through holes 432 formed on the first baffle plate 430 are in communication with selected ones of the plurality of through holes 442 to thus form align holes. The opening position of the align holes is changed depending on a distance by which the first baffle plate 430 is rotated by the rotating mechanism 490.

Figure 20A:
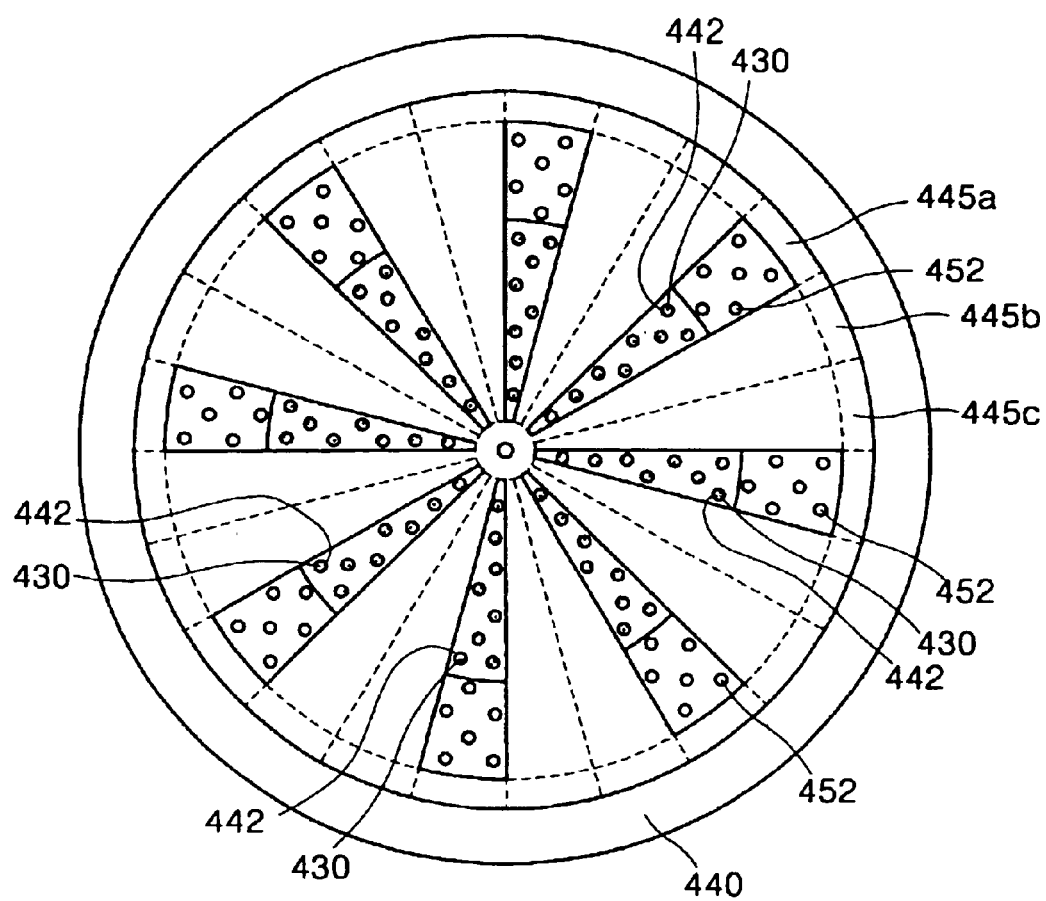
FIGS. 20A–20C illustrate views of a bottom of the second baffle plate when the first and second baffle plates included in the shower head of FIG. 17 contact each other with different rotational distances.
Figure 20B:
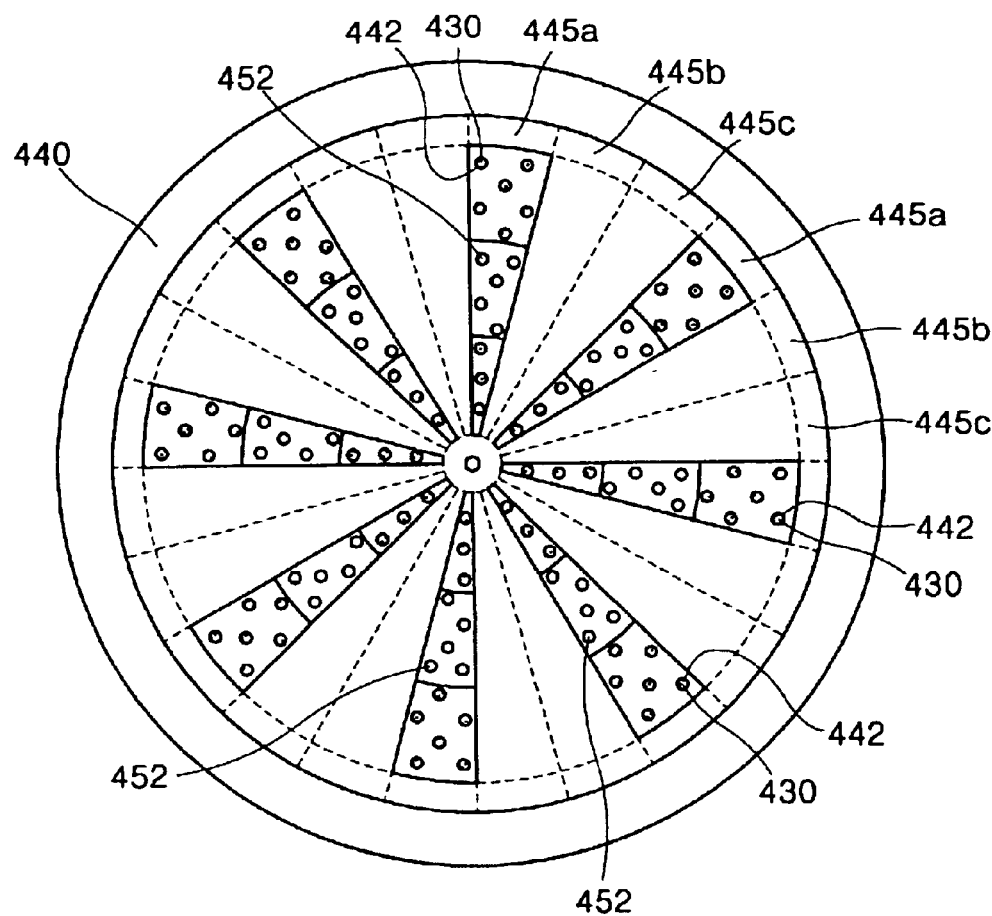
Figure 20C:
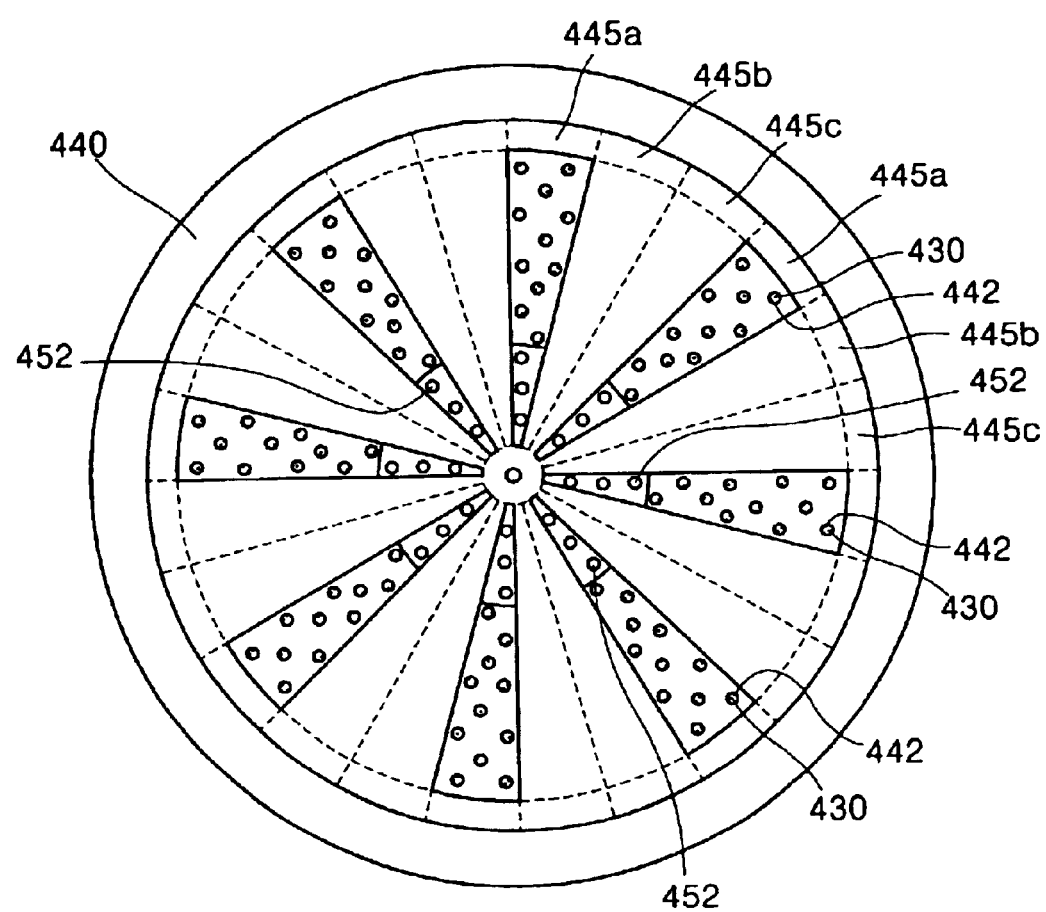

FIGS. 20A–20C illustrate views from the bottom of the second baffle plate 440 when the first and second baffle plates 430 and 440 contact each other with different rotational distances. That is, FIGS. 20A–20C show changes in positions of the align holes formed when the first baffle plate 430 contacts the second baffle plate 440 while the first baffle plate 430 is rotated at various angles by the rotating mechanism 490.

More specifically, FIG. 20A shows a state in which the first baffle plate 430 has rotated by a predetermined angular distance by the rotating mechanism 490 so that the sectorial region 435a of the first baffle plate 430 and the sectorial region 445a of the second baffle plate 440 overlap each other. In this case, only the plurality of through holes 432 formed in the first range 436a among the sectorial region 435a of the first baffle plate 430 communicate with the plurality of through holes 442 formed in the sectorial region 445a of the second baffle plate 440. As a result, align holes 452 are formed only in the first range 436a, and the remaining through holes 442 formed in the second baffle plate 440 are blocked by the first baffle plate 430. Thus, when the first baffle plate 430 contacts the second baffle plate 440 as shown in FIG. 20A, a greater amount of reaction gas is supplied from the process region within the reaction chamber to an edge on the wafer.

FIG. 20B illustrates a state in which the first baffle plate 430 has rotated by a predetermined angular distance by the rotating mechanism 490 so that the sectorial region 435b of the first baffle plate 430 and the sectorial region 445a of the second baffle plate 440 overlap each other. In this case, only the plurality of through holes 442 formed in the second range 436b among the sectorial region 435a of the first baffle plate 430 communicate with the plurality of through holes 442 formed in the sectorial region 445a of the second baffle plate 440. As a result, the align holes 452 are formed only in the second range 436b, and the remaining through holes 442 formed in the second baffle plate 440 are blocked by the first baffle plate 430. Thus, when the first baffle 430 contacts the second baffle plate 440 as shown in FIG. 20B, a greater amount of reaction gas is supplied from the process region within the reaction chamber to an intermediate region between a central region and an edge on the wafer.

FIG. 20C illustrates a state in which the first baffle plate 430 has rotated by a predetermined angular distance by the rotating mechanism 490 so that the sectorial region 435c of the first baffle plate 430 and the sectorial region 445a of the second baffle plate 440 overlap each other. In this case, only the plurality of through holes 432 formed in the third range 436c among the sectorial region 435c of the first baffle plate 430 communicate with the plurality of through holes 442 formed in the sectorial region 445a of the second baffle plate 440. As a result, the align holes 452 are formed only in the third range 436c, and the remaining through holes 442 formed in the second baffle plate 440 are blocked by the first baffle plate 430. Thus, when the first baffle 430 contacts the second baffle plate 440 as shown in FIG. 20C, a greater amount of reaction gas is supplied from the process region to a region near a central portion on the wafer within the reaction chamber.

As described above, the opening position of the align holes 452 formed by overlapping the first and second baffle plates 430 and 440 varies with the rotational distance of the first baffle plate which is varied by the rotating mechanism 490. Thus, in order to adjust the amount of reactant gas supplied to a particular position on the wafer within the process region, the rotating mechanism 490 is used to control the rotational angle of the first baffle plate 430 and thus select the opening position of the align holes 452.

Figure 21:
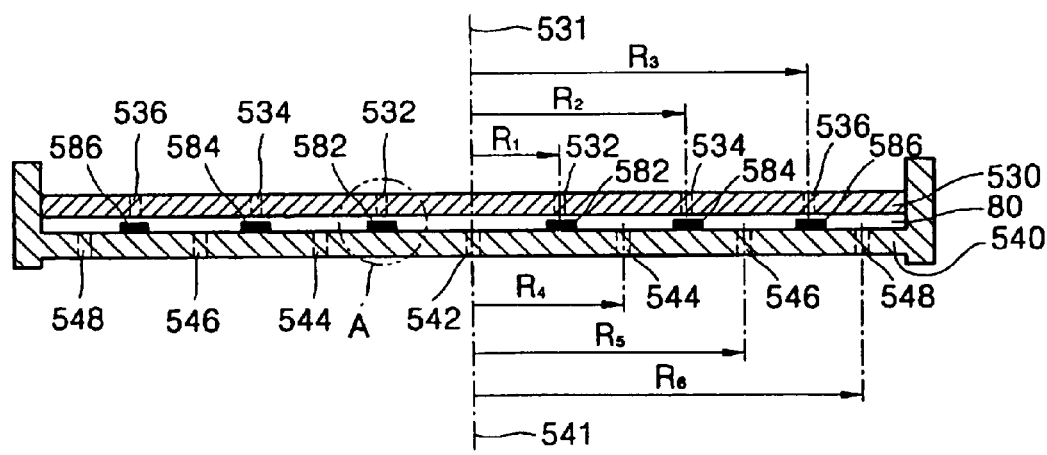
FIG. 21 illustrates a cross-sectional view showing the configuration of main parts of a shower head according to a fifth embodiment of the present invention.

FIG. 21 illustrates a cross-sectional view for explaining the configuration of main parts of a shower head according to a fifth embodiment of the present invention. In FIG. 21, the same elements are denoted by the same reference numerals, and a detailed explanation thereof will be omitted.

Similar to the first embodiment shown in FIG. 1, the shower head according to the fifth embodiment shown in FIG. 21 includes a first baffle plate 530 disposed between the top plate 10 and the face plate 20 and a second baffle plate 540 disposed between the first baffle plate 530 and the face plate 20. The second baffle plate 540 has a top surface that limits the second gap 80 for forming a flow passage of the reactant gas between the first and second baffle plates 530 and 540. In order to control the amount of the reactant gas through the second gap 80 formed between the first and second baffle plates 530 and 540, a plurality of piezoelectric elements 582, 584, and 586 are disposed on the top surface of the second baffle plate 540.

Figure 22:
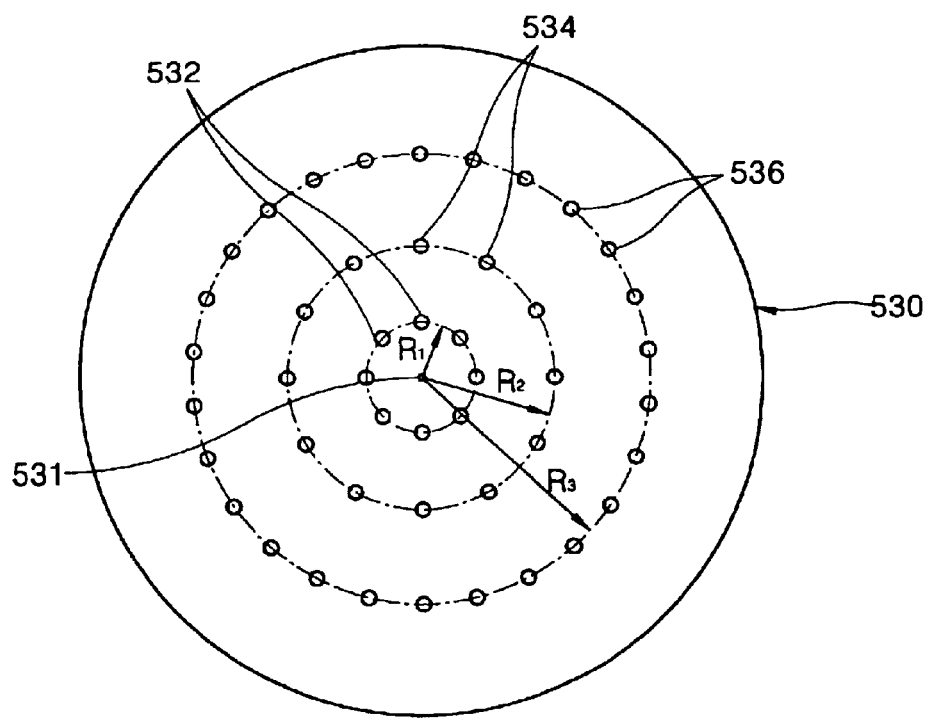
FIG. 22 illustrates a top view of the first baffle plate included in the shower head of FIG. 21.

FIG. 22 illustrates a top view of the first baffle plate 530. As shown in FIG. 22, the first baffle plate 530 has a plurality of first, second and third through holes 532, 534, and 536. The plurality of first through holes 532 are formed at a position separated from a central axis 531 of the first baffle plate 530 by a first radius $R_1$. The plurality of second through holes 534 are formed at a position separated from the central axis 531 thereof by a second radius $R_2$, which is greater than the first radius $R_1$. The plurality of third through holes 536 are formed at a position separated from the central axis 531 by a third radius $R_3$, which is greater than the second radius $R_2$.

Figure 23:
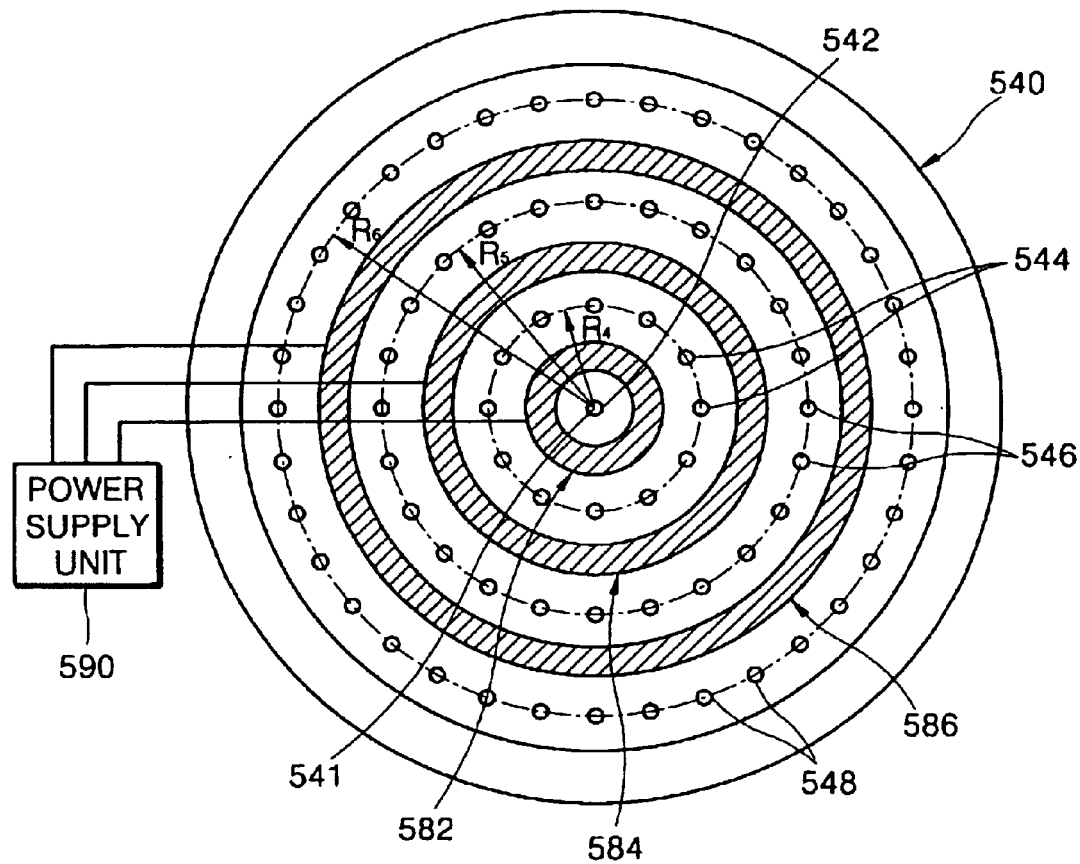
FIG. 23 illustrates a top view of the second baffle plate included in the shower head of FIG. 21.

FIG. 23 is a top view of the second baffle plate 540. As shown in FIG. 23, the second baffle plate 540 has a fourth through hole 542 and a plurality of fifth, sixth, and seventh through holes 544, 546, and 548, respectively. The fourth through hole 542 is formed at a position of a central axis 541 of the second baffle plate 540. The plurality of fifth through holes 544 are formed at a position separated from the central axis 541 by a fourth radius $R_4$. The plurality of sixth through holes 546 are formed at a position separated from the central axis 541 by a fifth radius $R_5$, which is greater than the fourth radius $R_4$. The plurality of seventh through holes 548 are formed at a position separated from the central axis 541 by a sixth radius $R_6$, which is greater than the fifth radius $R_5$.

The plurality of piezoelectric elements 582, 584, 586 includes a first annular piezoelectric element 582 disposed between the fourth and fifth through holes 542 and 544 on the second baffle plate 540, a second piezoelectric element 584 disposed between the fifth and sixth through holes 544 and 546 on the second baffle plate 540, and a third piezoelectric element 586 disposed between the sixth and seventh through holes 546 and 548 on the second baffle plate 540. The first through third piezoelectric elements 582, 584, and 586 are bonded to the second baffle plate 540. The position at which the first piezoelectric element 582 is located on the second baffle plate 540 corresponds to the position at which the plurality of first through holes 532 of the first baffle plate 530 are formed. The position at which the second piezoelectric element 584 is located on the second baffle plate 540 corresponds to the position at which the plurality of second through holes 534 of the first baffle plate 530 are formed. The position at which the third piezoelectric element 586 is located on the second baffle plate 540 corresponds to the position at which the plurality of third through holes 536 of the first baffle plate 530 are formed.

Figure 24:
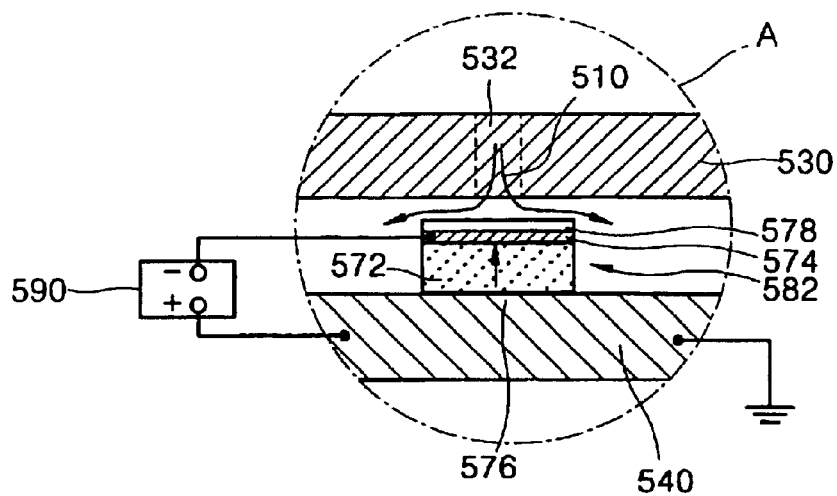
FIG. 24 illustrates an enlarged view of the portion "A" of FIG. 21.

FIG. 24 illustrates an enlarged view of a portion "A" of FIG. 21. Referring to FIGS. 21–24, each of the plurality of piezoelectric elements 582, 584, and 586 includes a piezoelectric layer 572 vibrating in a thickness extensional mode according to an application of a voltage. The piezoelectric element 572 may be formed of lead zirconate titanate (PZT), $PbTiO_3$, $BaTiO_3$, or poly vinylidene fluoride (PVDF) polymer. The piezoelectric layer 572 has two main faces at either side thereof on which first and second electrodes 574 and 576 are formed, respectively. An insulating layer 578 is formed on the first electrode 574 adjacent to the first baffle plate 530. The second electrode 576 is constructed by the second baffle plate 540. That is, the second baffle plate 540 additionally serves as the second electrode 576. Thus, the piezoelectric element 582 includes a bonding surface between the piezoelectric layer 572 and the second baffle plate 540. In this case, the second baffle plate 540 is preferably formed of aluminum.

A voltage is applied to the piezoelectric elements 582, 584, and 586 from a power supply unit 590. The thickness expansion rate of the piezoelectric layer 572 of each of the piezoelectric elements 582, 584, and 586 may be controlled by the level of voltage applied from the power supply unit 590. The thickness expansion rate of the piezoelectric layer 572 adjusts the distance between the first piezoelectric element 582 and the first through hole 532 and consequently the amount of a reactant gas 510 flowing from the first through hole 532 of the first baffle plate 530 into the second gap 80. Since the thickness expansion rate of the piezoelectric layer 572 is controlled by adjusting the level of a voltage supplied from the power supply unit 590, the supplied voltage selectively opens or closes the first through holes 532 of the first baffle plate 530. The above configuration of the first piezoelectric element 582 is similarly applied to the second and third piezoelectric elements 584 and 586. Adopting the configuration cannot only selectively open or close through holes, which are spaced apart from the central axis 531 of the first baffle plate 530 by a desired radius among the first through third though holes 532, 534, and 536 formed in the first baffle plate 530, but can also adjust the amount of reactant gas flowing through the through holes. Thus, the piezoelectric elements 582, 584, and 586, each of which has a thickness expansion rate varying depending on the level of an applied voltage, are used to selectively control the amount of the reactant gas flowing through the plurality of first through third through holes 532, 534, and 536 formed in the first baffle plate 530 according to the amount of reactant gas required on a specific position on the wafer within the process region of the reaction chamber.

Although not shown, the shower head having the configuration as described above with reference to FIG. 21 may further include the guide baffle plate 50 disposed on the first baffle plate 530 as described above with reference to FIGS. 5A–5C. In this case, a gap corresponding to the first gap 70 is formed between the guide baffle plate 50 and the first baffle plate 530, thereby providing a lateral flow passage of the reactant gas.

The shower head may further include the third baffle plate 60 disposed between the second baffle plate 540 and the face plate 20 as described above with reference to FIG. 7.

As described with reference to FIGS. 21–24, if the piezoelectric elements 582, 584, and 586 are used to adjust the amount of reactant gas between the first and second baffle plates 530 and 540, the amount of the reactant gas supplied is adjusted in a radial direction from the center of the shower head according to the level of a voltage applied from the power supply unit 590. Accordingly, no mechanical movement is required in the shower head while improving control performance for adjusting the amount of reaction gas supplied.

As described above, a shower head according to the present invention includes a gap controller for determining the width of a gap for forming a flow passage of reactant gas between adjacent two baffle plates. The width of the gap is selectively decreased or increased by the gap controller, thereby adjusting the amount of reactant gas supplied to a particular position on a wafer in a process region of a reaction chamber and making the amount of the reactant gas supplied to a position on the wafer even or uneven depending on the type of application.

Thus, according to the present invention, it is easier to adjust the distribution of the reactant gas depending on a position on the wafer in order to obtain optimized etch rate uniformity over the entire wafer surface during the fabrication process of a semiconductor device. Moreover, the present invention makes it possible to freely adjust the amount of reactant gas supplied, thereby compensating in advance for degradation in etch rate uniformity that may partially occur on the wafer during an etch step and consequently optimizing the etch rate uniformity. Thus, the present invention not only freely optimizes pattern uniformity depending on a position on the wafer but also does not need to significantly consider uniformity over the entire wafer surface, thereby reducing the time and costs in developing a semiconductor device manufacturing apparatus.

Preferred embodiments of the present invention have been disclosed herein, and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A shower head for supplying a reactant gas to a process region within a reaction chamber during manufacture of a semiconductor device, the shower head comprising:
   a top plate having a gas port for introducing the reactant gas supplied from an outside source into the reaction chamber;
   a face plate disposed opposite the process region, the face plate having a plurality of through holes;
   a first baffle plate, having a plurality of through holes, the first baffle plate disposed between the top plate and the face plate so that it is capable of moving up or down, the first baffle plate having a top surface that defines a first gap for forming a first lateral flow passage of the reactant gas;
   a second baffle plate, having a plurality of through holes, the second baffle plate disposed between the first baffle plate and the face plate so that it is capable of moving up or down, the second baffle plate having a top surface that defines a second gap for forming a second lateral flow passage of the reactant gas between the first and second baffle plates; and
   a gap controller that is capable of variably adjusting a width of the first gap and variably adjusting a width of the second gap by varying a width of the gap controller so as to move at least one of the first and second baffle plates.

2. The shower head as claimed in claim 1, wherein the plurality of through holes formed in the first baffle plate comprise:
   a plurality of first through holes formed at a first position which is proximate to a central axis of the first baffle plate and spaced apart in a radial direction from the central axis by a first distance; and
   a plurality of second through holes formed at a second position which is proximate to an edge of the first baffle plate and spaced apart in a radial direction from the central axis by a second distance greater than the first distance.

3. The shower head as claimed in claim 2, wherein the gap controller determines the position of the first baffle plate to decrease the width of the first gap so that the amount of the reactant gas flowing through the plurality of first through holes is greater than an amount of the reactant gas flowing through the plurality of second through holes.

4. The shower head as claimed in claim 2, wherein the gap controller determines the position of the first baffle plate to increase the width of the first gap so that the amount of the reactant gas flowing through the plurality of second through holes is increased.

5. The shower head as claimed in claim 1, wherein the gap controller determines the position of the second baffle plate to increase the width of the second gap so that the amount of the reactant gas flowing through the plurality of through holes formed in the second baffle plate is made uniform over the entire process region.

6. The shower head as claimed in claim 1, wherein the gap controller determines the position of the second baffle plate to decrease the width of the second gap so that the amount of the reactant gas flowing through the plurality of through holes formed in the second baffle plate is selectively made to vary depending on a position in the process region.

7. The shower head as claimed in claim 1, wherein the gap controller comprises:
   a first spacer ring disposed on top of the first baffle plate for determining the width of the first gap; and
   a second spacer ring disposed between the first and second baffle plates for determining the width of the second gap.

8. The shower head as claimed in claim 7, wherein the first spacer ring is disposed on a top edge of the first baffle plate, and the second spacer ring is disposed on a top edge of the second baffle plate.

9. The shower heas as claimed in claim 7, wherein the first spacer ring is composed of one or more annular rings.

10. The shower head as claimed in claim 7, wherein the second spacer ring is composed of one or more annular rings.

11. The shower head as claimed in claim 7, wherein at least one of the first and second spacer rings has an annular contact portion in which a plurality of sawtooth gears are formed.

12. The shower head as claimed in claim 11, wherein each of the plurality of sawtooth gears has a pitch corresponding to the length of an arc of a central angle 90°.

13. The shower head as claimed in claim 7, wherein the height of each sawtooth gear of the annular contact portion is in the range of approximately 0.01–0.5 mm.

14. The shower head as claimed in claim 7, wherein the first spacer ring has an annular contact portion comprised of a plurality of sawtooth gears formed opposite the first baffle plate, and
   wherein the first baffle plate includes a spacer ring coupler having a plurality of sawtooth gears formed opposite the first spacer ring to mesh with the plurality of sawtooth gears of the annular contact portion.

15. The shower head as claimed in claim 14, wherein each of the plurality of sawtooth gears of the spacer ring coupler has a pitch corresponding to the length of an arc of a central angle 90°.

16. The shower head as claimed in claim 14, wherein the height of each sawtooth gear of the spacer ring coupler is in the range of approximately 0.01–0.5 mm.

17. The shower head as claimed in claim 7, wherein the second spacer ring has an annular contact portion comprised of a plurality of sawtooth gears formed opposite the second baffle plate, and
   wherein the second baffle plate includes a spacer ring coupler having a plurality of sawtooth gears formed opposite the second spacer ring to mesh with the plurality of sawtooth gears of the annular contact portion.

18. The shower head as claimed in claim 17, wherein each of the plurality of sawtooth gears of the spacer ring coupler has a pitch corresponding to the length of an arc of a central angle 90°.

19. The shower head as claimed in claim 17, wherein the height of each sawtooth gear of the spacer ring coupler is in the range of approximately 0.01–0.5 mm.

20. The shower head as claimed in claim 1, wherein the first baffle plate is comprised of a single disk-type element having a uniform thickness over the entire surface.

21. The shower head as claimed in claim 1, wherein the first baffle plate comprises:
   a disk-like base plate having a plurality of through holes and a groove for providing a circular space at the center of a top surface thereof; and
   a disk-like insert plate inserted to rotate about a central axis of the first baffle plate within the groove, the disk-like insert plate having a plurality of through holes in communication with selected ones of the plurality of through holes formed in the base plate.

22. The shower head as claimed in claim 21, wherein the plurality of through holes formed in the base plate comprise:
   a plurality of first through holes formed at a first position that is proximate to the central axis of the first baffle plate and spaced apart in a radial direction from the central axis by a first distance less than a radius of the insert plate; and
   a plurality of second through holes formed at a second position that is proximate to an edge of the base plate and spaced apart in a radial direction from the central axis by a second distance greater than the radius of the insert plate, and
   wherein the plurality of first through holes are in communication with the plurality of through holes formed in the insert plate depending on rotational distance of the insert plate.

23. The shower head as claimed in claim 22, wherein, in order to change the opening ratio of the first through holes depending on the rotational distance of the insert plate, the plurality of through holes in the insert plate and the plurality of first through holes in the base plate are formed selectively only in some angular ranges with respect to the central axis of the first baffle plate.

24. The shower head as claimed in claim 1, further comprising a guide baffle plate disposed on the first baffle plate coaxially with respect to the first baffle plate, the guide baffle plate having an inlet for introducing the reactant gas supplied through the top plate and a plurality of outlets for flowing the reactant gas introduced through the inlet out into the first gap through a plurality of passages,
   wherein the width of the first gap is defined by a bottom of the guide baffle plate and a top surface of the first baffle plate.

25. The shower head as claimed in claim 24, wherein the plurality of outlets formed in the guide baffle plate are formed at a position spaced apart in a radial direction from a central axis of the guide baffle plate by a predetermined distance.

26. The shower head as claimed in claim 25, wherein the plurality of through holes comprise:
   a plurality of first through holes formed at a first position which is proximate to a central axis of the first baffle plate and spaced apart in a radial direction from the central axis by a first distance; and
   a plurality of second through holes formed at a second position which is proximate to an edge of the first baffle plate and spaced apart in a radial direction from the central axis by a second distance greater than the first distance, and
   wherein the plurality of outlets formed in the guide baffle plate are formed at a position that is spaced apart in a radial direction from the central axis of the guide baffle plate by a third distance greater than the first distance and less than the second distance.

27. The shower head as claimed in claim 26, wherein a distance between each of the plurality of outlets and each of the plurality of first through holes is less than the distance between each of the plurality of outlets and each of the plurality of second through holes.

28. The shower head as claimed in claim 24, wherein the gap controller comprises:
   a first spacer ring disposed between the guide baffle plate and the first baffle plate for determining the width of the first gap; and a second spacer ring disposed between the first and second baffle plates for determining the width of the second gap.

29. The shower heas as claimed in claim 28, wherein the first and second spacer rings, respectively, are composed of one or more annular rings.

30. The shower head as claimed in claim 28, wherein at least one of the first and second spacer rings has an annular contact portion in which a plurality of sawtooth gears are formed.

31. The shower head as claimed in claim 30, wherein each of the plurality of sawtooth gears has a pitch corresponding to the length of an arc of a central angle 90°.

32. The shower head as claimed in claim 30, wherein the height of each sawtooth gear of the annular contact portion is in the range of approximately 0.01–0.5 mm.

33. The shower head as claimed in claim 28, wherein the first spacer ring has an annular contact portion comprised of a plurality of sawtooth gears formed opposite the first baffle plate, and
wherein the first baffle plate comprises a spacer ring coupler having a plurality of sawtooth gears formed opposite the first spacer ring to mesh with the plurality of sawtooth gears of the annular contact portion.

34. The shower head as claimed in claim 33, wherein each of the plurality of sawtooth gears of the spacer ring coupler has a pitch corresponding to the length of an arc of a central angle 90°.

35. The shower head as claimed in claim 33, wherein the height of each sawtooth gear of the spacer ring coupler is in the range of approximately 0.01–0.5 mm.

36. The shower head as claimed in claim 28, wherein the second spacer ring has an annular contact portion comprised of a plurality of sawtooth gears formed opposite the second baffle plate, and
wherein the second baffle plate includes a spacer ring coupler having a plurality of sawtooth gears formed opposite the second spacer ring to mesh with the plurality of sawtooth gears of the annular contact portion.

37. The shower head as claimed in claim 36, wherein each of the plurality of sawtooth gears of the spacer ring coupler has a pitch corresponding to the length of an arc of a central angle 90°.

38. The shower head as claimed in claim 36, wherein the height of each sawtooth gear of the spacer ring coupler is in the range of approximately 0.01–0.5 mm.

39. The shower head as claimed in claim 24, wherein the gap controller comprises:
a first driving shaft for selectively moving the guide baffle plate upwardly or downwardly in order to determine the width of the first gap; and
a second driving shaft for selectively moving the first baffle plate upwardly or downwardly in order to determine the width of the second gap.

40. The shower head as claimed in claim 39, wherein the first driving shaft is installed coaxially with the second driving shaft.

41. The shower head as claimed in claim 24, wherein the gap controller comprises:
an elevating mechanism for moving the first baffle plate upwardly or downwardly using a first stepping in order to determine the width of the second gap; and
a rotating mechanism for moving the guide baffle plate upwardly or downwardly by a gear drive using a second stepping motor in order to determine the width of the first gap, and wherein the elevating mechanism is integrated with the rotating mechnism.

42. The shower head as claimed in claim 41, wherein the elevating mechanism comprises a shaft, which extends to pass through the guide baffle plate and the first baffle plate, and an outward flange disposed at one end of the shaft for moving the first baffle plate upwardly or downwardly to follow the upward or downward movement of the shaft, and
wherein the rotating mechanism includes the shaft which is rotatable by power transmitted from the second stepping motor, and an external screw formed on an outer circumference of the shaft where the guide baffle plate is combined, for raising or lowering the guide baffle plate according to the rotation of the shaft.

43. The shower head as claimed in claim 42, wherein a circular space for housing the outward flange formed at the end of the shaft is formed at the central portion of the first baffle plate.

44. The shower head as claimed in claim 42, wherein a central hole, through which the shaft passes, is formed at a central portion of the guide baffle plate, and an internal thread for mating with the external thread of the screw of the shaft is formed on an inner wall of the central hole.

45. The shower head as claimed in claim 42, wherein an internal thread for mating with the external thread of the screw is formed in the guide baffle plate so that the guide baffle plate is moved upwardly or downwardly to follow the movement of the shaft when the shaft is moved up or down by the elevating mechanism in order to raise or lower the first baffle plate.

46. The shower head as claimed in claim 42, wherein the circular space for housing the outward flange without friction is formed in the first baffle plate so that the rotation of the outward range dose not affect the first baffle plate when the shaft is rotated by the rotating mechanism in order to raise or lower the guide baffle plate.

47. The shower head as claimed in claim 42, further comprising a stopper for preventing the guide baffle plate from rotating when the shaft is rotated by the rotating mechanism.

48. The shower head as claimed in claim 1, further comprising a rotating mechanism connected to the first baffle plate so that the first baffle plate rotates with respect to the second baffle plate in a predetermined angular machine,
wherein the first baffle plate contacts the second baffle plate so that selected ones of the plurality of through holes formed in the first baffle plate are in communication with selected ones of the plurality of through holes formed in the second baffle plate to thereby form align holes.

49. The shower head as claimed in claim 48, wherein the width of the second gap is effectively zero.

50. The shower head as claimed in claim 48, wherein the plurality of through holes formed in the first baffle plate are distributed to have different opening ratios depending on a radius from the central axis of the first baffle plate,
wherein the plurality of through holes formed in the second baffle plate are distributed to have different opening ratios depending on the distance by which the first baffle plate rotates about the central axis of the second baffle plate, and
wherein the rotating mechanism changes the rotational distance of the first baffle plate in order to change the opening position of the align holes.

51. The shower head of claim 50, wherein the first baffle plate is divided into a plurality of sectorial regions that extend in a radial direction from the cetral axis thereof, each sectorial region having a plurality of through holes formed only in predetermined range spaced apart from the central axis by selected radius.

52. The shower head of claim 50, wherein the second baffle plate is divided into a plurality of sectorial regions that extend in a radial direction from the central axis thereof, and the plurality of sectorial regions having the plurality of through holes are arranged at regular intervals.

53. The shower head of claim 48, wherein the gap controller comprises a driving shaft for simultaneously moving the first and second baffle plates upwardly or downwardly in order to determine the width of the first gap.

54. The shower head of claim 53, further comprising a guide baffle plate disposed on the first baffle plate coaxially with respect to the first baffle plate, the guide baffle plate having an inlet for introducing the reactant gas supplied throuh the top plane and a plurality of outlets for flowing the reactant gas that has been intoduced through the inlet into the first gap through a plurality of passages,
wherein the width of the first gap is defined by a bottom of the guide baffle plate and a top surface of the first baffle plate.

55. The shower head of claim 54, wherein the plurality of outlets in the guide baffle plate are formed at a position spaced apart in a radial direction from a central axis of the guide baffle plate by a predetermined distance.

56. A shower head for supplying a reactant gas to a process region within a reaction chamber, the shower head comprising:
a first baffle plate having a plurality of first and second through holes in order to selectively adjust the amount of the reactant gas supplied from an outside source according to a radius from the central axis, wherein the plurality of first through holes are spaced from a central axis by a first radius and the plurality of second through holes are spaced apart from the central axis by a second radius;
a second baffle plate disposed below the first baffle plate so that a gap for providing a lateral flow passage is formed between the first and second baffle plates, the second baffle plate having a plurality of through holes; and
a gap controller for moving at least one of the first and second baffle plates in order to variably adjust the width of the gap.

57. The shower head of claim 56, wherein the gap controller comprises a spacer ring having a predetermined thickness disposed between the first and second baffle plates for determining the width of the gap.

58. The shower head of claim 57, wherein the spacer ring is formed on a top edge of the second baffle plate.

59. The shower head of claim 57, wherein the spacer ring is composed of one or more annular rings.

60. The shower head of claim 57, wherein the spacer ring has an annular contact portion in which a plurality of sawtooth gears are formed.

61. The shower head of claim 60, wherein each of the plurality of sawtooth gears has a pitch corresponding to the length of an arc of a central angle 90°.

62. The shower head of claim 60, wherein the height of each sawtooth gear of the annular contact portion is in the range of approximately 0.01–0.5 mm.

63. The shower head of claim 60, wherein the annular contact portion of the spacer ring contacts a bottom surface of the first baffle plate, and
wherein a spacer ring coupler having a plurality of sawtooth gears formed to mesh with the plurality of sawtooth gears of the annular contact portion is formed on the edge of the bottom surface of the first baffle plate.

64. The shower head of claim 63, wherein the space ring coupler of the first baffle plate has a portion having a thickness less than a thickness of a bottom central portion of the first baffle plate.

65. The shower head of claim 60, wherein the annular contact portion of spacer ring contacts a top surface of the second baffle plate, and
wherein a spacer ring coupler having a plurality of sawtooth gears formed to mesh with the plurality of sawtooth gears of the annular contact portion is formed on the top surface of the second baffle plate.

66. The shower head of claim 65, wherein the spacer ring coupler of the second baffle plate has a portion having a thickness less than a thickness of a top central portion of the second baffle plate.

67. The shower head of claim 56, wherein the first baffle plate is comprised of a single disk-type element having a uniform thickness over the entire surface.

68. The shower head of claim 56, wherein the first baffle plate comprises:
a disk-like base plate having a central portion in which a groove for providing a circular space is formed, and a plurality of through holes for constructing some of the plurality of the first through holes at the central portion thereof; and
a disk-like insert plate inserted so that it can rotate about a central axis of the first baffle plate within the groove, the disk-like insert plate having a plurality of through holes that can communicate with the plurality of through holes formed at the central portion of base plate in order to form the first through holes.

69. The shower head of claim 68, wherein, in order to change the opening ratio of the first through holes depending on the rotational distance of the insert plate, the plurality of through holes in the insert plate and the plurality of through holes in the base plate are formed selectively only in some angular ranges with respect to the central axis of the first baffle plate.

70. The shower head of claim 70, wherein the gap controller comprises a driving shaft for selectively moving the first baffle plate upwardly or downwardly in order to determine the width of the gap.

71. The shower head of claim 56, wherein the first baffle plate contacts the second baffle plate so that some through holes selected among the plurality of first and second through holes formed in the first baffle plate communicate with selected ones of the plurality of through holes formed in the second baffle plate in order to form align holes, and
wherein the width of the gap is effectively zero.

72. The shower head of claim 71, further comprising a rotating mechanism connected to the first baffle plate so that the first baffle plate rotates with respect to the second baffle plate in a predetermined angular range.

73. The shower head of claim 72, wherein the plurality of through holes formed in the second baffle plate are distributed to have different opening ratios depending on the distance by which the first baffle plate rotates about the central axis of the second baffle plate, and
wherein the rotating mechanism changes the rotational angle of the first baffle plate in order to change the opening position of the align holes.

74. The shower head of claim 72, wherein the first baffle plate further has a plurality of third through holes formed in a third radius range greater than the second radius range, wherein the first baffle plate is divided into a plurality of sectorial regions that extend in a radial direction from the central axis thereof, and wherein the plurality of first, second, and third through holes are formed at different sectorial regions.

75. The shower head of claim 73, wherein the second baffle plate is divided into a plurality of sectorial regions that extend in a radial direction from the central axis thereof, and the plurality of sectorial regions having the plurality of through holes are arranged at regular intervals.

76. The shower head of claim 56, further comprising a face plate disposed opposite the process region, the face plate having a plurality of through holes.

77. The shower head of claim 76, further comprising a third baffle plate disposed between the second baffle plate and the face plate, the third baffle plate having a plurality of through holes.

78. The shower head of claim 77, wherein the third baffle plate is formed of silicon carbide.

* * * * *